United States Patent
Tanimoto et al.

(10) Patent No.: US 9,136,461 B2
(45) Date of Patent: Sep. 15, 2015

(54) POLYMERIC PIEZOELECTRIC MATERIAL AND PROCESS FOR PRODUCING THE SAME

(71) Applicants: Kazuhiro Tanimoto, Chiba (JP); Mitsunobu Yoshida, Ichihara (JP); Shigeo Nishikawa, Chiba (JP); Masaki Shimizu, Sodegaura (JP)

(72) Inventors: Kazuhiro Tanimoto, Chiba (JP); Mitsunobu Yoshida, Ichihara (JP); Shigeo Nishikawa, Chiba (JP); Masaki Shimizu, Sodegaura (JP)

(73) Assignee: MITSUI CHEMICALS, INC., Tokyo (JP)

(*) Notice: Subject to any disclaimer, the term of this patent is extended or adjusted under 35 U.S.C. 154(b) by 0 days.

(21) Appl. No.: 13/990,677

(22) PCT Filed: Oct. 12, 2012

(86) PCT No.: PCT/JP2012/076520
§ 371 (c)(1),
(2) Date: May 30, 2013

(87) PCT Pub. No.: WO2013/054918
PCT Pub. Date: Apr. 18, 2013

(65) Prior Publication Data
US 2014/0084204 A1 Mar. 27, 2014

(30) Foreign Application Priority Data
Oct. 13, 2011 (JP) ................. 2011-225899
Feb. 24, 2012 (JP) ................. 2012-039368

(51) Int. Cl.
| | | |
|---|---|---|
| H01L 41/193 | (2006.01) | |
| C08G 63/02 | (2006.01) | |
| C08G 63/06 | (2006.01) | |
| C08G 63/08 | (2006.01) | |
| B29D 7/01 | (2006.01) | |
| H01L 41/047 | (2006.01) | |
| H01L 41/18 | (2006.01) | |
| H01L 41/22 | (2013.01) | |
| H01L 41/33 | (2013.01) | |
| H01L 41/35 | (2013.01) | |
| C08J 5/18 | (2006.01) | |
| C08K 5/29 | (2006.01) | |
| C08L 67/04 | (2006.01) | |
| B29C 71/02 | (2006.01) | |
| H01L 41/45 | (2013.01) | |

(52) U.S. Cl.
CPC .............. *H01L 41/193* (2013.01); *B29D 7/01* (2013.01); *C08G 63/02* (2013.01); *C08G 63/06* (2013.01); *C08G 63/08* (2013.01); *C08J 5/18* (2013.01); *C08J 7/08* (2013.01); *C08K 5/29* (2013.01); *C08L 67/04* (2013.01); *H01L 41/0478* (2013.01); *H01L 41/18* (2013.01); *H01L 41/22* (2013.01); *H01L 41/33* (2013.01); *H01L 41/35* (2013.01); *H01L 41/45* (2013.01); *C08J 2367/04* (2013.01)

(58) Field of Classification Search
CPC ........ C08G 63/02; C08G 63/06; C08G 63/08; C08J 5/18; C08J 2367/04; B29D 7/01; H01L 41/0478; H01L 41/18; H01L 41/22; H01L 41/33; H01L 41/35
USPC .......... 252/62.9; 264/479, 291; 525/410, 411, 525/415, 450; 528/361, 502 B
See application file for complete search history.

(56) References Cited

U.S. PATENT DOCUMENTS

| | | | |
|---|---|---|---|
| 7,368,493 B2 * | 5/2008 | Takahashi et al. ............ 524/195 |
| 2006/0216805 A1 | 9/2006 | Ueda | |
| 2011/0118395 A1 * | 5/2011 | Kiuchi et al. ................. 524/116 |
| 2012/0025674 A1 * | 2/2012 | Yoshida et al. ............... 310/365 |

FOREIGN PATENT DOCUMENTS

| | | |
|---|---|---|
| JP | 5-152638 A | 6/1993 |
| JP | 9-110968 A | 4/1997 |
| JP | H11-80522 A | 3/1999 |
| JP | 2000-144545 A | 5/2000 |
| JP | 2001-261797 A | 9/2001 |
| JP | 2002-293943 A | 10/2002 |
| JP | 2005-203590 A | 7/2005 |
| JP | 2005-213376 A | 8/2005 |
| JP | 2007-231194 A | 9/2007 |
| JP | 2010-132899 A | 6/2010 |
| JP | 2011-243606 A | 12/2011 |
| TW | 201039474 A1 | 11/2010 |
| WO | WO 2010/004799 A1 * | 1/2010 |
| WO | WO 2010/104196 A1 | 9/2010 |
| WO | WO 2012/026494 A1 | 3/2012 |

OTHER PUBLICATIONS

Harrison, J.S., et al.; Piezoelectric Polymers, 2002, p. 474-498.*

(Continued)

Primary Examiner — Robert Jones, Jr.
(74) Attorney, Agent, or Firm — Buchanan, Ingersoll & Rooney PC

(57) ABSTRACT

A polymeric piezoelectric material having an aliphatic polyester (A) with a weight-average molecular weight of from 50,000 to 1,000,000 and having optical activity, and a stabilizing agent (B) with a weight-average molecular weight of from 200 to 60,000 having at least one kind of functional group selected from the group consisting of a carbodiimide group, an epoxy group and an isocyanate group, wherein the crystallinity of the material obtained by a DSC method is from 20% to 80%, and a content of the stabilizing agent (B) is from 0.01 part by mass to 10 parts by mass with respect to 100 parts by mass of the aliphatic polyester (A), as well as a process for producing the same, is provided.

12 Claims, No Drawings

(56) References Cited

OTHER PUBLICATIONS

International Search Report (PCT/ISA/210) issued on Nov. 13, 2012, by the Japanese Patent Office as the International Searching Authority for International Application No. PCT/JP2012/076520.
Written Opinion (PCT/ISA/237) issued on Nov. 13, 2012, by the Japanese Patent Office as the International Searching Authority for International Application No. PCT/JP2012/076520.
Third Party Observation (Form PCT/IB/345) dated Jul. 30, 2013, issued in corresponding International Application No. PCT/JP2010/076520 and English Translation thereof. (12 pgs).
Office Action (Notice of Opinion of First Office Action) issued on Oct. 17, 2014, by the State Intellectual Property Office of People's Republic of China, in corresponding Chinese Patent Application No. 201280007258.3, and a partial English translation of the Office Action (9 pages).

* cited by examiner

POLYMERIC PIEZOELECTRIC MATERIAL AND PROCESS FOR PRODUCING THE SAME

TECHNICAL FIELD

The present invention relates to a polymeric piezoelectric material and a process for producing the same.

BACKGROUND ART

As a piezoelectric material a ceramic material of PZT ($PbZrO_3$—$PbTiO_3$ type solid solution) has been heretofore broadly used, however, since PZT contains lead, a polymeric piezoelectric material, which imposes less environmental burden and has higher flexibility, has been coming into use.

Currently known polymeric piezoelectric materials can be classified roughly into 2 types. Namely, 2 types of poled polymers, as represented by nylon 11, polyvinyl fluoride, polyvinyl chloride, polyurea, etc. and ferroelectric polymers, as represented by ($\beta$-type) polyvinylidene fluoride (PVDF), a vinylidene fluoride-trifluoroethylene copolymer (P(VDF-TrFE)) (75/25), etc. However, polymeric piezoelectric materials are inferior to PZT in terms of piezoelectricity, and therefore improvement of the piezoelectricity has been demanded. In order to cope with the above, attempts at improvement of the piezoelectricity of polymeric piezoelectric materials have been made from various viewpoints.

For example, PVDF and P(VDF-TrFE), which are ferroelectric polymers, have superior piezoelectricity among polymers and a piezoelectric constant $d_{31}$ of 20 pC/N or higher. A film material formed from PVDF or P(VDF-TrFE) is imparted with piezoelectricity by orientating polymer chains by a stretching operation in the stretching direction; then building up opposite electric charges on the back and front sides of the film by means of corona discharge, etc. to generate an electric field perpendicular to the film surface and to orientate permanent dipoles containing fluorine in side chains of the polymer chains parallel to the electric field. However, there has been a problem in view of practical use that the orientation of permanent dipoles achieved by a poling treatment tends to relax, because an opposite electric charge of water or an ion in the air can easily attach to a polarized film surface in the direction of canceling the orientation, and the piezoelectricity declines remarkably with time.

Although PVDF is a material that exhibits the highest piezoelectricity among the above described polymeric piezoelectric materials, its dielectric constant is 13 and relatively high among polymeric piezoelectric materials, and therefore the piezoelectric g constant (open circuit voltage per unit stress), which is a value obtained by dividing a piezoelectric d constant by a dielectric constant, becomes small. In addition, although PVDF exhibits favorable conversion efficiency from electricity to sound, improvement in the conversion efficiency from sound to electricity has been looked for.

In recent years, use of an aliphatic polyester having optical activity, such as polylactic acid, has drawn attention in addition to the above polymeric piezoelectric materials. A polylactic acid type polymer is known to exhibit piezoelectricity by a simple mechanical stretching operation.

Among polymers having optical activity, the piezoelectricity of a polymer crystal, such as polylactic acid, results from permanent dipoles of C=O bonds existing in the screw axis direction. Especially, polylactic acid, in which the volume fraction of side chains with respect to a main chain is small and the content of permanent dipoles per volume is large, thereby constituting a sort of ideal polymer among polymers having helical chirality.

Polylactic acid exhibiting piezoelectricity only by a stretching treatment does not require a poling treatment and is known to maintain the piezoelectric modulus without decrease for several years.

Since polylactic acid exhibits various piezoelectric properties as described above, various polymeric piezoelectric materials using polylactic acid have been reported.

For example, a polymeric piezoelectric material exhibiting a piezoelectric modulus of approximately 10 pC/N at normal temperature, which is attained by a stretching treatment of a molding of polylactic acid, has been disclosed (e.g., see Japanese Patent Application Laid-Open (JP-A) No. 5-152638).

Further, it has been also reported that high piezoelectricity of approximately 18 pC/N can be achieved by a special orientation method called as a forging process for orientating highly polylactic acid crystals (e.g., see JP-A-2005-213376).

SUMMARY OF INVENTION

Technical Problem

However, both piezoelectric materials described in JP-A-5-152638 and JP-A-2005-213376 are insufficient in terms of transparency. Additionally, since an aliphatic polyester such as polylactic acid is hydrolyzable, there is a problem of low reliability in the use as a piezoelectric element in an environment causing hydrolysis by moisture in the air or the like. The present invention has been made in view of the above circumstances and provides a highly reliable polymeric piezoelectric material with improved moist heat resistance, and a process for producing the same.

Solution to Problem

Specific means to attain the object are as follows.
[1] A polymeric piezoelectric material comprising an aliphatic polyester (A) with a weight-average molecular weight of from 50,000 to 1,000,000 and having optical activity; and a stabilizing agent (B) with a weight-average molecular weight of from 200 to 60,000 having at least one kind of functional group selected from the group consisting of a carbodiimide group, an epoxy group and an isocyanate group, wherein the crystallinity of the material obtained by a DSC method is from 20% to 80%, and a content of the stabilizing agent (B) is from 0.01 part by mass to 10 parts by mass with respect to 100 parts by mass of the aliphatic polyester (A).
[2] The polymeric piezoelectric material according to [1], wherein the stabilizing agent (B) comprises a stabilizing agent (B3) having, in a molecule, a functional group selected from the group consisting of a carbodiimide group, an epoxy group and an isocyanate group.
[3] The polymeric piezoelectric material according to at least one of [1] or [2], wherein internal haze with respect to visible light is 50% or less, and a piezoelectric constant $d_{14}$ measured by a displacement method at 25° C. is 1 pm/V or higher.
[4] The polymeric piezoelectric material according to at least one of [1] or [3], wherein the stabilizing agent (B) comprises a stabilizing agent (B1) with a weight-average molecular weight of from 200 to 900 having at least one kind of functional group selected from the group consisting of a carbodiimide group, an epoxy group and an isocyanate group, and a stabilizing agent (B2) with a weight-average molecular weight of from 1,000 to 60,000 having, in a molecule, 2 or more functional groups of 1 or more kinds selected from the group consisting of a carbodiimide group, an epoxy group and an isocyanate group.

[5] The polymeric piezoelectric material according to any one of [1] to [4], wherein internal haze is 13% or less.

[6] The polymeric piezoelectric material according to any one of [1] to [5], wherein a content of the stabilizing agent (B) is from 0.01 to 2.8 parts by mass with respect to 100 parts by mass of the aliphatic polyester (A).

[7] The polymeric piezoelectric material according to any one of [1] to [6], wherein a product of a standardized molecular orientation MORc measured by a microwave transmission molecular orientation meter based on a reference thickness of 50 μm and the crystallinity is from 40 to 700.

[8] The polymeric piezoelectric material according to any one of [1] to [7], wherein the aliphatic polyester (A) is a polylactic acid polymer having a main chain comprising a repeating unit represented by the following formula (1):

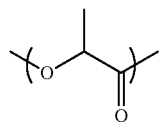

(1)

[9] The polymeric piezoelectric material according to any one of [1] to [8], wherein the aliphatic polyester (A) has an optical purity of 95.00% ee or higher.

[10] The polymeric piezoelectric material according to any one of [1] to [9], wherein a content of the aliphatic polyester (A) is 80 mass % or higher.

[11] The polymeric piezoelectric material according to any one of [1] to [10], wherein an area of the principal plane is 5 mm² or higher.

[12] A process for producing the polymeric piezoelectric material according to any one of [1] to [11] comprising a first step for yielding a pre-crystallized sheet comprising the aliphatic polyester (A) and the stabilizing agent (B), and a second step for stretching the pre-crystallized sheet mainly uniaxially.

[13] The process for producing the polymeric piezoelectric material according to [12], wherein an annealing treatment is conducted after the second step.

[14] A process for producing the polymeric piezoelectric material according to any one of [1] to [11] comprising, in the following order a step for stretching, mainly uniaxially, a sheet comprising the aliphatic polyester (A) and the stabilizing agent (B); and a step for conducting an annealing treatment.

Advantageous Effects of Invention

By virtue of the present invention, a polymeric piezoelectric material having high reliability with improved moist heat resistance, and a process for producing the same can be provided.

DESCRIPTION OF EMBODIMENTS

A polymeric piezoelectric material according to the present invention contains an aliphatic polyester (A) with a weight-average molecular weight of from 50,000 to 1,000,000 and having optical activity (hereinafter occasionally referred to as "a polymer (A)"), and a stabilizing agent (B) with a weight-average molecular weight of from 200 to 60,000 having at least one kind of functional group selected from the group consisting of a carbodiimide group, an epoxy group and an isocyanate group (hereinafter occasionally referred to as "a stabilizing agent (B)"), wherein the crystallinity of the material obtained by a DSC method is from 20% to 80%, and a content of the stabilizing agent (B) is from 0.01 part by mass to 10 parts by mass with respect to 100 parts by mass of the aliphatic polyester (A). By constituting a polymeric piezoelectric material according to the above composition, the polymeric piezoelectric material can have superior reliability with high piezoelectric constant $d_{14}$ and improved transparency and moist heat resistance.

In this regard, according to a preferable embodiment, internal haze of the polymeric piezoelectric material with respect to visible light is 50% or less, and the piezoelectric constant $d_{14}$ measured by a displacement method at 25° C. is 1 pm/V or higher. Internal haze of a polymeric piezoelectric material according to the present invention is preferably 13% or less.

In this connection, a "piezoelectric constant $d_{14}$" is a kind of tensor of a piezoelectric modulus and determined from the degree of polarization appeared in the direction of shear stress, when the shear stress is applied in the direction of the stretching axis of a stretched material. Specifically, the appeared electric charge density per unit shear stress is defined as $d_{14}$. A higher value of the piezoelectric constant $d_{14}$ means that piezoelectricity is the higher. An abbreviated expression of "piezoelectric constant" means herein a "piezoelectric constant $d_{14}$". Meanwhile a piezoelectric constant $d_{14}$ is a value determined by the following method. Namely, a rectangular film with the longitudinal direction inclined to 45° from the stretching direction is used as a specimen. Electrode layers are formed on the entire surfaces of both sides of the principal plane of the specimen. The amount of strain in the longitudinal direction of the film, which occurs upon application of a voltage E(V) to the electrodes, is regarded as X. Regarding the quotient of application voltage E(V) divided by film thickness t (m) as electric field strength E (V/m), and the amount of strain in the longitudinal direction of the film caused by the application voltage E(V) as X, $d_{14}$ is a value defined as 2× amount of strain X/electric field strength E (V/m).

A complex piezoelectric modulus $d_{14}$ is calculated as $d_{14}=d_{14}'-id_{14}''$, wherein $d_{14}'$ and $d_{14}''$ are obtained by Rheolograph-Solid, Model S-1 (by Toyo Seiki Seisaku-Sho, Ltd.). $d_{14}'$ represents the real part of a complex piezoelectric modulus, $id_{14}''$ represents the imaginary part of a complex piezoelectric modulus, and $d_{14}'$ (the real part of the complex piezoelectric modulus) corresponds to the piezoelectric constant $d_{14}$ of the current embodiment. A higher value of the real part of a complex piezoelectric modulus means that the piezoelectricity is the better. There are a piezoelectric constant $d_{14}$ measured by a displacement method (unit: pm/V) and the same measured by a resonance method (unit: pC/N).

[Aliphatic Polyester (A) Having Optical Activity]

An aliphatic polyester having optical activity refers to an aliphatic polyester having optical activity derived from the molecular structure, such as an aliphatic polyester having optical activity, whose molecular structure is a helical structure. Examples of an aliphatic polyester having optical activity (hereinafter also referred to as an "optically active polymer") a polylactic acid polymer, and a poly(β-hydroxybutyrate). Further, an aliphatic polyester having optical activity is preferably a helical chiral polymer, whose piezoelectricity can be easily increased.

The optical purity of an optically active polymer (A) according to the current embodiment is preferably 95.00% ee or higher, more preferably 96.00% ee or higher, further preferably 99.00% ee or higher, and still further preferably 99.99% ee or higher from a viewpoint of enhancing the piezoelectricity of a polymeric piezoelectric material. Ideally it is 100.00% ee. It is presumed that, by selecting the optical purity of an optically active polymer in the above range, packing of a polymer crystal exhibiting piezoelectricity becomes denser and as a result the piezoelectricity is increased.

The optical purity of an optically active polymer in the current embodiment is a value calculated according to the following formula:

Optical purity(% *ee*)=100×|*L*-form amount−*D*-form amount|/(*L*-form amount+*D*-form amount);

namely a value of "the difference(absolute value)between L-form amount [mass %] of the optically active polymer and D-form amount [mass %] of the optically active polymer" divided by "the total of L-form amount [mass %] of the optically active polymer and D-form amount [mass %] of the optically active polymer" multiplied by "100" is defined as optical purity.

In this regard, for the L-form amount [mass %] of an optically active polymer and the D-form amount [mass %] of an optically active polymer, values to be obtained by a method using high performance liquid chromatography (HPLC) are used. Specific particulars with respect to a measurement will be described below.

Among the above optically active polymers, a compound with the main chain containing a repeating unit according to the following formula (1) is preferable from a viewpoint of enhancement of the optical purity and improving the piezoelectricity.

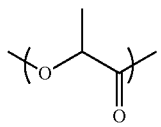

(1)

As an example of a compound with the main chain containing a repeating unit according to the formula (1) is named a polylactic acid-type polymer. Among others polylactic acid is preferable, and a homopolymer of L-lactic acid (PLLA) or a homopolymer of D-lactic acid (PDLA) is most preferable. In this connection, the polylactic acid-type polymer in the current embodiment means a "polylactic acid (a polymer constituted solely with repeating units derived from monomer(s) selected out of L-lactic acid and D-lactic acid)", a "copolymer of at least one of L-lactic acid or D-lactic acid and a compound polymerizable with the L-lactic acid or the D-lactic acid", or a mixture of the two.

The "polylactic acid" is a polymer linking lactic acid by polymerization through ester bonds into a long chain, and it is known that polylactic acid can be produced by a lactide process via a lactide, a direct polymerization process, by which lactic acid is heated in a solvent under a reduced pressure for polymerizing while removing water, or the like. Examples of the "polylactic acid" include a homopolymer of L-lactic acid, a homopolymer of D-lactic acid, a block copolymer including a polymer of at least one of L-lactic acid and D-lactic acid, and a graft copolymer including a polymer of at least one of L-lactic acid and D-lactic acid.

Examples of the "compounds copolymerizable with L-lactic acid or D-lactic acid" include a hydroxycarboxylic acid, such as glycolic acid, dimethyl glycolic acid, 3-hydroxybutyric acid, 4-hydroxybutyric acid, 2-hydroxypropanoic acid, 3-hydroxypropanoic acid, 2-hydroxyvaleric acid, 3-hydroxyvaleric acid, 4-hydroxyvaleric acid, 5-hydroxyvaleric acid, 2-hydroxycaproic acid, 3-hydroxycaproic acid, 4-hydroxycaproic acid, 5-hydroxycaproic acid, 6-hydroxycaproic acid, 6-hydroxymethylcaproic acid, and mandelic acid; a cyclic ester, such as glycolide, β-methyl-δ-valerolactone, γ-valerolactone, and ∈-caprolactone; a polycarboxylic acid, such as oxalic acid, malonic acid, succinic acid, glutaric acid, adipic acid, pimelic acid, azelaic acid, sebacic acid, undecanedioic acid, dodecanedioic acid, and terephthalic acid, and an anhydride thereof; a polyhydric alcohol, such as ethyleneglycol, diethyleneglycol, triethyleneglycol, 1,2-propanediol, 1,3-propanediol, 1,3-butanediol, 1,4-butanediol, 2,3-butanediol, 1,5-pentanediol, 1,6-hexanediol, 1,9-nonanediol, 3-methyl-1,5-pentanediol, neopentylglycol, tetramethyleneglycol, and 1,4-hexanedimethanol; a polysaccharide such as cellulose; and an aminocarboxylic acid such as α-amino acid.

Examples of the "copolymer of at least one of L-lactic acid or D-lactic acid and a compound polymerizable with the L-lactic acid or the D-lactic acid" include a block copolymer or a graft copolymer having a polylactic acid sequence, which can form a helical crystal.

The concentration of a structure derived from a copolymer component in an optically active polymer (A) is preferably 20 mol % or less. For example, if an optically active polymer (A) is a polylactic acid-type polymer, with respect to the total number of moles of a structure derived from lactic acid and a structure derived from a compound copolymerizable with lactic acid (copolymer component) in the polymer, the copolymer component is preferably 20 mol % or less.

The polylactic acid-type polymer can be produced, for example, by a process for yielding the polymer by direct dehydration condensation of lactic acid, as described in JP-A-59-096123 and JP-A-7-033861, or a process for yielding the same by a ring-opening polymerization of lactide, which is a cyclic dimer of lactic acid, as described in U.S. Pat. No. 2,668,182 and No. 4,057,357.

In order to make the optical purity of an optically active polymer yielded by any of the production processes to 95.00% ee or higher, for example, if a polylactic acid is produced by a lactide process, it is preferable to polymerize lactide, whose optical purity has been enhanced to 95.00% ee or higher by a crystallization operation.

The content of an optically active polymer (A) in a polymeric piezoelectric material according to the present invention is preferably 80 mass % or higher.

[Weight-Average Molecular Weight of Optically Active Polymer (A)]

The weight-average molecular weight (Mw) of an optically active polymer (A) according to the current embodiment is from 50,000 to 1,000,000. If the lower limit of the weight-average molecular weight (Mw) of an optically active polymer (A) is less than 50,000, the mechanical strength of a molding from the optically active polymer becomes insufficient. The lower limit of the weight-average molecular weight of an optically active polymer is preferably 100,000 or higher, and more preferably 200,000 or higher. Meanwhile, if the upper limit of the weight-average molecular weight of an optically active polymer exceeds 1,000,000, molding of an optically active polymer by extrusion molding, etc. to a film, etc. becomes difficult. The upper limit of the weight-average molecular weight is preferably 800,000 or less, and more preferably 300,000 or less.

Further, the molecular weight distribution (Mw/Mn) of the optically active polymer (A) is preferably from 1.1 to 5, more preferably from 1.2 to 4, and further preferably from 1.4 to 3, from a viewpoint of the strength of a polymeric piezoelectric material.

The weight-average molecular weight Mw and the molecular weight distribution (Mw/Mn) of an optically active polymer (A) are measured using a gel permeation chromatograph (GPC) by the following GPC measuring method.

GPC measuring apparatus: GPC-100 by Waters Corp.

Column: SHODEX LF-804 by Showa Denko K.K.

Preparation of sample: An optically active polymer (A) is dissolved in a solvent (e.g. chloroform) at 40° C. to prepare a sample solution with the concentration of 1 mg/mL.

Measurement condition: A sample solution 0.1 mL is introduced into a column at a temperature of 40° C. and a flow rate of 1 mL/min by using chloroform as a solvent.

The sample concentration in a sample solution separated by the column is measured by a differential refractometer. Based on polystyrene standard samples, a universal calibration curve is created and the weight-average molecular weight (Mw) and the molecular weight distribution (Mw/Mn) of an optically active polymer (A) are calculated.

For a polylactic acid-type polymer, a commercial polylactic acid may be used, and examples thereof include PURASORB (PD, PL) by Purac Corporate and LACEA (H-100, H-400) by Mitsui Chemicals, Inc. If a polylactic acid-type polymer is used as an optically active polymer and in order to make the weight-average molecular weight (Mw) of the polylactic acid-type polymer 50,000 or higher, it is preferable to produce an optically active polymer by a lactide process, or a direct polymerization process.

[Stabilizing Agent (B)]

A stabilizing agent (B) to be used in the current embodiment is a compound with the weight-average molecular weight of from 200 to 60,000 having at least one kind of functional group selected from the group consisting of a carbodiimide group, an epoxy group, and an isocyanate group. The stabilizing agent (B) is used for inhibiting hydrolysis of the aliphatic polyester so as to improve the moist heat resistance of a product piezoelectric material.

For the sake of inhibiting hydrolysis of an aliphatic polyester, many methods have been known including a method of reducing a low molecular weight compound, such as an unreacted monomer, impurities, and an open-chain or cyclic oligomer, in a polymer such as polyester (e.g. JP-A-9-12688); a method of adding an aromatic carbodiimide (e.g. Japanese National Publication of International Patent Application No. 2001-525473); a method of adding an oxazoline compound (e.g. JP-A-2007-77193); and the like. However, a method for improving the reliability of a polymeric piezoelectric material containing an aliphatic polyester having optical activity and the structure described below, by inhibiting hydrolysis of the aliphatic polyester in the piezoelectric material, and without compromising significantly the piezoelectric properties and transparency, has not been yet known.

The inventors found through investigation that by adding in a specific amount a stabilizing agent (B) having a specific functional group to an aliphatic polyester (A) having an optical property, the moist heat resistance and the reliability of a polymeric piezoelectric material can be improved by inhibiting hydrolysis of an aliphatic polyester without compromising significantly the piezoelectric properties and transparency, thereby completing the present invention.

Although the action of the present invention is not clear, it is presumed as follows:

Hydrolysis of an aliphatic polyester (A) proceeds presumably according to the following scheme. Therefore for inhibiting the hydrolysis, such methods as inhibiting a contact with moisture by lamination or otherwise, forming a bridging structure at a hydrolyzed site in the system, and blocking off a free carboxy group are conceivable. It is so understood that according to the present invention by using a stabilizing agent having a functional group easily interactable with both a hydroxy group and a carboxy group, and more preferably a stabilizing agent having a functional group easily interactable with plural hydroxy groups and carboxy groups, the hydrolysis can be inhibited.

More particularly, the above can be understood as follows. By using a compound which is a stabilizing agent having a functional group interactable with both a hydroxy group and a carboxyl group and at the same time has a molecular weight within a specific range, the compound can move easily during crystallization of an aliphatic polyester (A) from a part that can crystallize easily (specifically, a region where molecular chains are not broken) to a part that can hardly crystallize (a region where a part of molecular chains are broken and hydroxy groups or carboxy groups are generated). As a result, a stabilizing agent exists denser and uniformly in a low crystallinity part where moist heat resistance is low, than in a high crystallinity part, so that moist heat resistance can be improved efficiently without inhibiting crystallization of a part that can crystallize easily.

Meanwhile, if a compound having an oxazoline group, which is known as a stabilizing agent for an aliphatic polyester (A), is used, the oxazoline group reacts with a carboxy group, but hardly reacts with a hydroxy group. Consequently, during crystallization of an aliphatic polyester (A) oxazoline exists also in a part that is easily crystallizable to disturb crystallization, and further, depending on the structure of the compound, it may act as a nucleus for crystal growth to form a large crystal locally. Therefore there is concern about decrease in the transparency of a polymeric piezoelectric material. Further, an improving effect on moist heat resistance cannot be obtained sufficiently, conceivably because oxazoline hardly moves to a low crystallinity part.

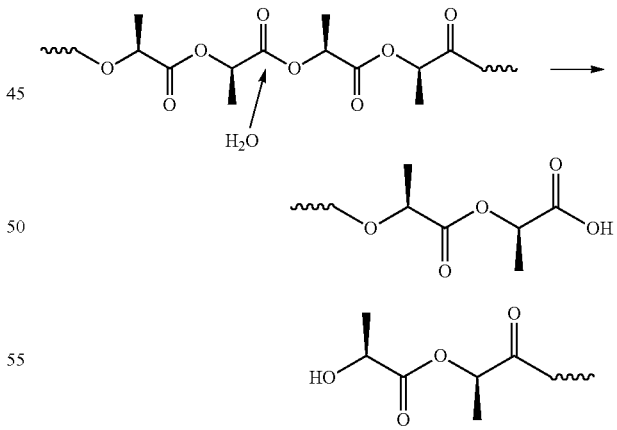

Examples of a specific functional group that can interact both a hydroxy group and a carboxy group in order to inhibit hydrolysis according to the above scheme include at least 1 kind of functional group selected from the group consisting of a carbodiimide group, an isocyanate group, and an epoxy group having the following structures, and among others a carbodiimide group is preferable from a viewpoint of effectiveness.

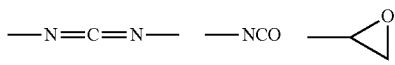

The weight-average molecular weight of a stabilizing agent (B) used in the current embodiment is preferably from 200 to 60,000, more preferably from 200 to 30,000, and further preferably from 300 to 18,000. It is presumed that, if the molecular weight is within the above range, a stabilizing agent (B) can move easily as described in the above action, and an improving effect on moist heat resistance can be attained sufficiently.

(Carbodiimide Compound)

A carbodiimide compound having a carbodiimide group to be used as a stabilizing agent (B) according to the present invention has 1 or more carbodiimide groups in a molecule. As carbodiimide compounds (including a polycarbodiimide compound), those synthesized by a publicly known process can be used. Examples thereof include those synthesized from various isocyanates which are subjected to a decarboxylation condensation reaction without a solvent or in an inert solvent at a temperature of approx. 70° C. or higher using an organic phosphorous compound or an organometallic compound as a catalyst.

Examples of a monocarbodiimide compound included in the carbodiimide compound include dicyclohexylcarbodiimide, dimethylcarbodiimide, diisobutylcarbodiimide, dioctylcarbodiimide, t-butylisopropylcarbodiimide, diphenylcarbodiimide, di-t-butylcarbodiimide, and di-β-naphthyl carbodiimide, and among others, especially from a standpoint of easy industrial availability, dicyclohexylcarbodiimide, or bis-2,6-diisopropylphenylcarbodiimide is appropriate.

As a polycarbodiimide compound included in the carbodiimide compound, products of various processes can be used. Products of heretofore known processes for producing polycarbodiimide (for example, U.S. Pat. No. 2,941,956, Japanese Published Examined Application No. 47-33279, J. Org. Chem. 28, 2069-2075 (1963), Chemical Review 1981, Vol. 81, No. 4, p 619-621) can be used. Specifically, a carbodiimide compound described in Japanese Patent No. 4084953 can be also used.

Examples of a polycarbodiimide compound include poly(4,4'-dicyclohexylmethanecarbodiimide), poly(tetramethylxylylenecarbodiimide), poly(N,N-dimethylphenylcarbodiimide), and poly(N,N'-di-2,6-diisopropylphenylcarbodiimide), and there is no particular restriction, insofar as a carbodiimide compound has such a function and 1 or more carbodiimide groups in a molecule.

As a carbodiimide compound a commercial product may be used, and examples thereof include B2756 (trade name) by Tokyo Chemical Industry Co., Ltd., CARBODILITE LA-1 by Nisshinbo Chemical Inc., and STABAXOL P, STABAXOL P400, and STABAXOL I (all are trade names) by Rhein Chemie Rheinau GmbH (Isocyanate Compound)

Examples of a compound having an isocyanate group (isocyanate compound) to be used as a stabilizing agent (B) according to the present invention include hexylisocyanate, cyclohexyl isocyanate, benzyl isocyanate, phenethyl isocyanate, butyl isocyanatoacetate, dodecyl isocyanate, octadecyl isocyanate, 3-(triethoxysilyl)propyl isocyanate, 2,4-tolylene diisocyanate, 2,6-tolylene diisocyanate, m-phenylene diisocyanate, p-phenylene diisocyanate, 4,4'-diphenylmethane diisocyanate, 2,4'-diphenylmethane diisocyanate, 2,2'-diphenylmethane diisocyanate, 3,3'-dimethyl-4,4'-biphenylene diisocyanate, 3,3'-dimethoxy-4,4'-biphenylene diisocyanate, 3,3'-dichloro-4,4'-biphenylene diisocyanate, 1,5-naphthalene diisocyanate, 1,5-tetrahydronaphthalene diisocyanate, tetramethylene diisocyanate, 1,6-hexamethylene diisocyanate, dodecamethylene diisocyanate, trimethylhexamethylene diisocyanate, 1,3-cyclohexylene diisocyanate, 1,4-cyclohexylene diisocyanate, xylylene diisocyanate, tetramethylxylylene diisocyanate, hydrogenated xylylene diisocyanate, lysine diisocyanate, isophorone diisocyanate, 4,4'-dicyclohexylmethane diisocyanate, or 3,3'-dimethyl-4,4'-dicyclohexylmethane diisocyanate, diphenylmethane diisocyanate-type polyisocyanate, 1,6-hexamethylene diisocyanate-type polyisocyanate, xylylenediisocyanate-type polyisocyanate, and isophoronediisocyanate-type polyisocyanate.

(Epoxy Compound)

Examples of a compound having an epoxy group (epoxy compound) to be used as a stabilizing agent (B) according to the present invention include N-glycidyl phthalimide, orthophenylphenyl glycidyl ether, phenyl glycidyl ether, p-t-butylphenyl glycidyl ether, hydroquinone diglycidyl ether, resorcinol diglycidyl ether, 1,6-hexanediol diglycidyl ether, diethyleneglycol diglycidyl ether, polyethylene glycol diglycidyl ether, trimethylolpropane triglycidyl ether, bisphenol A-diglycidyl ether, hydrogenated bisphenol A-diglycidyl ether, a phenol novolac-type epoxy resin, a cresol novolac-type epoxy resin, and an epoxidized polybutadiene.

Stabilizing agents (B) related to the current embodiment may be used singly or in combination of 2 or more thereof. Examples of a preferable mode of a stabilizing agent (B) include a mode, in which a stabilizing agent (B1) having at least one kind of functional group selected from the group consisting of a carbodiimide group, an epoxy group, and an isocyanate group, and having the number-average molecular weight of from 200 to 900, and a stabilizing agent (B2) having in a molecule 2 or more functional groups of 1 or more kinds selected from the group consisting of a carbodiimide group, an epoxy group, and an isocyanate group, and having the weight-average molecular weight of from 1,000 to 60,000 are used in combination. In this regard, the weight-average molecular weight of a stabilizing agent (B1) with the number-average molecular weight of from 200 to 900 is about from 200 to 900, and the number-average molecular weight and the weight-average molecular weight of a stabilizing agent (B1) give almost the same values.

Specific examples of a stabilizing agent (B1) include dicyclohexylcarbodiimide, bis-2,6-diisopropylphenylcarbodiimide, hexyl isocyanate, octadecyl isocyanate, 3-(triethoxysilyl) propyl isocyanate, N-glycidyl phthalimide, orthophenylphenyl glycidyl ether, phenyl glycidyl ether, and p-t-butylphenyl glycidyl ether.

While specific examples of a stabilizing agent (B2) include poly(4,4'-dicyclohexylmethane carbodiimide), poly(tetramethylxylylene carbodiimide), poly(N,N-dimethylphenylcarbodiimide), poly(N,N'-di-2,6-diisopropylphenylcarbodiimide), diphenylmethane diisocyanate-type polyisocyanate, a 1,6-hexamethylene diisocyanate-type polyisocyanate, a xylylene diisocyanate-type polyisocyanate, an isophorone diisocyanate-type polyisocyanate, a phenol novolac-type epoxy resin, a cresol novolac-type epoxy resin, and epoxidized polybutadiene.

By containing a stabilizing agent (B1) with a relatively low molecular weight and a multifunctional stabilizing agent (B2) with a relatively high molecular weight, especially moist heat resistance is improved. Regarding the balance between the added amounts of the two, a higher content of a stabilizing agent (B1), which is monofunctional and has a relatively low molecular weight, is preferable from a viewpoint of enhanced transparency, and the amount of a stabilizing agent (B2) with respect to 100 parts by mass of a stabilizing agent (B1) is preferably in a range of from 10 parts by mass to 150 parts by mass from a viewpoint of coexistence of transparency and moist heat resistance and more preferably in a range of from 50 parts by mass to 100 parts by mass.

Further, a mode in which a stabilizing agent (B) contains a stabilizing agent (B3) having in a molecule a functional group selected from the group consisting of a carbodiimide group, an epoxy group, and an isocyanate group, is also a preferable mode from a viewpoint of enhancing the dimensional stability. Since a stabilizing agent (B3) contains in a molecule only one functional group selected from the group consisting of a carbodiimide group, an epoxy group, and an isocyanate group, a region of an optically active polymer (A) having hydroxy groups and carboxyl groups generated by hydrolysis interleaves the stabilizing agent (B3) and becomes hardly cross-linkable. As a result, presumably, molecular chains of an optically active polymer (A) are flexibly displaced moderately to deconcentrate internal stress in a polymeric piezoelectric material so that the dimensional stability of a polymeric piezoelectric material is improved.

The weight-average molecular weight of a compound having in a molecule a functional group selected from the group consisting of a carbodiimide group, an epoxy group, and an isocyanate group is preferably from 200 to 2,000, more preferably from 200 to 1,500, and further preferably from 300 to 900.

Specific examples of a compound having in a molecule a functional group selected from the group consisting of a carbodiimide group, an epoxy group, and an isocyanate group include dicyclohexylcarbodiimide, bis-2,6-diisopropylphenylcarbodiimide, hexyl isocyanate, octadecyl isocyanate, 3-(triethoxysilyl)propyl isocyanate, N-glycidylphthalimide, ortho-phenylphenyl glycidyl ether, phenyl glycidyl ether, and p-t-butylphenyl glycidyl ether. Among them, dicyclohexylcarbodiimide and bis-2,6-diisopropylphenylcarbodiimide are preferable, and bis-2,6-diisopropylphenylcarbodiimide is further preferable.

A stabilizing agent (B3) and a stabilizing agent (B4) having in a molecule 2 or more functional groups selected from the group consisting of a carbodiimide group, an epoxy group, and an isocyanate group (for example, the stabilizing agent (B2) is included) may be used in combination. The amount of a stabilizing agent (B4) having in a molecule 2 or more functional groups selected from the group consisting of a carbodiimide group, an epoxy group, and an isocyanate group with respect to 100 parts by mass of a stabilizing agent (B3) is preferably in a range of from 5 parts by mass to 200 parts by mass, from a viewpoint of the balance among transparency, moist heat resistance and dimensional stability, and more preferably in a range of from 10 parts by mass to 100 parts by mass.

[Weight-Average Molecular Weight and Number-Average Molecular Weight of Stabilizing Agent (B)]

The number-average molecular weight (Mn) and the weight-average molecular weight (Mw) of a stabilizing agent (B) are measured same as described in a section for an optically active polymer (A) by a measuring method using gel permeation chromatograph (GPC). They can be measured in addition to GPC by a measuring method, such as GC-MS, FAB-MS, ESI-MS, and TOF-MS.

The added amount of a stabilizing agent (B) with respect to 100 parts by mass of an aliphatic polyester (A) having optical activity is preferably from 0.01 part by mass to 10 parts by mass. Further, in order to attain higher reliability (more specifically the reliability at 500 hours according to the reliability test described below) the added amount is more preferably 0.7 part by mass or more. Especially, if an aliphatic carbodiimide is used as a stabilizing agent, the content of from 0.01 part by mass to 2.8 parts by mass is further preferable from a viewpoint of transparency. If the added amount is in the above range, the reliability of a piezoelectric material can be enhanced without compromising significantly internal haze of a polymeric piezoelectric material according to the present invention.

If 2 or more kinds of stabilizing agents (B) are used in combination, the added amount refers to the total amount thereof.

Meanwhile, from a viewpoint of lowering internal haze and enhancing or maintaining the piezoelectric constant, the added amount of a stabilizing agent (B) with respect to 100 parts by mass of an aliphatic polyester (A) having optical activity is preferably from 0.01 part by mass to 1.2 parts by mass, further preferably from 0.01 part by mass to 0.7 part by mass, and still further preferably from 0.01 part by mass to 0.6 part by mass.

[Other Components]

A polymeric piezoelectric material of the current embodiment may contain, to the extent that the advantage of the current embodiment be not compromised, other components, such as publicly known resins as represented by polyvinylidene fluoride, a polyethylene resin and a polystyrene resin, inorganic fillers including silica, hydroxyapatite, and montmorillonite, and publicly known crystal nucleating agents including phthalocyanine.

—Inorganic Filler—

For example, in order to form a polymeric piezoelectric material to a transparent film inhibiting generation of a void such as an air bubble, an inorganic filler such as hydroxyapatite may be dispersed into a polymeric piezoelectric material in a nano-state. However for dispersing an inorganic filler into a nano-state, large energy is required to disintegrate an aggregate, and if the filler is not dispersed in a nano-state the film transparency may occasionally be compromised. If a polymeric piezoelectric material according to the current embodiment contains an inorganic filler, the content of an inorganic filler with respect to the total mass of the polymeric piezoelectric material is preferably less than 1 mass %. Further, if a polymeric piezoelectric material contains components other than an aliphatic polyester, the content of the components other than an aliphatic polyester is preferably 20 mass % or less, and more preferably 10 mass % or less with respect to the total mass of the polymeric piezoelectric material.

Crystallization Accelerator (Crystal Nucleating Agent)

Although there is no particular restriction on a crystallization accelerator insofar as a crystal accelerating effect can be recognized, it is preferable to select a substance with the crystal structure having lattice spacing close to the lattice spacing of the crystal lattice of an aliphatic polyester. This is because a substance having closer lattice spacing has the higher activity as a nucleating agent. For example, if a polylactic acid-type polymer is used as an aliphatic polyester, examples include an organic substance, such as zinc phenylsulfonate, melamine polyphosphate, melamine cyanurate, zinc phenylphosphonate, calcium phenylphosphonate, and magnesium phenylphosphonate, and an inorganic substance, such as talc and clay. Among others, zinc phenylphosphonate, which has lattice spacing closest to the lattice spacing of polylactic acid and exhibits excellent crystallization accelerating activity, is preferable. Meanwhile, a commercial product can be used as a crystallization accelerator. Specific examples thereof include ECOPROMOTE (zinc phenylphosphonate: by Nissan Chemical Ind., Ltd.).

The content of a crystal nucleating agent with respect to 100 parts by mass of an aliphatic polyester is normally from 0.01 part by mass to 1.0 part by mass, preferably from 0.01 part by mass to 0.5 part by mass, and from a viewpoint of better crystallization accelerating activity and maintenance of a biomass ratio especially preferably from 0.02 part by mass to 0.2 part by mass. If the content of a crystal nucleating agent is less than 0.01 part by mass, the crystallization accelerating activity is not sufficient, and if it exceeds 1.0 part by mass, it becomes difficult to regulate the crystallization rate and the transparency of a polymeric piezoelectric material tends to decline.

From a viewpoint of transparency, a polymeric piezoelectric material should preferably not contain a component other than an aliphatic polyester (A) having optical activity and a stabilizing agent (B).

[Structure]

As described below, in a polymeric piezoelectric material of the current embodiment, molecules are highly orientated. Molecular orientation ratio MOR is used as an index representing the orientation. Namely, the molecular orientation ratio (MOR) is a value indicating the degree of molecular orientation, and measured by the following microwave measurement method. Namely, a sample (film) is placed in a microwave resonant waveguide of a well known microwave molecular orientation ratio measuring apparatus (also referred to as a "microwave transmission-type molecular orientation meter") such that the sample plane (film plane) is arranged perpendicular to the travelling direction of the microwaves. Then, the sample is continuously irradiated with microwaves whose oscillating direction is biased unidirectionally, while maintaining such conditions, the sample is rotated in a plane perpendicular to the travelling direction of the microwaves from 0 to 360°, and the intensity of the microwaves passed through the sample is measured to determine the molecular orientation ratio MOR.

Standardized molecular orientation MORc in the current embodiment means a MOR value to be obtained at the reference thickness tc of 50 μm, and can be determined by the following formula.

$$MORc = (tc/t) \times (MOR - 1) + 1$$

(tc: Reference thickness corrected to; t: Sample thickness)

A standardized molecular orientation MORc can be measured by a publicly known molecular orientation meter, e.g. a microwave-type molecular orientation analyzer MOA-2012A or MOA-6000 by Oji Scientific Instruments, at a resonance frequency in the vicinity of 4 GHz or 12 GHz.

The standardized molecular orientation MORc can be regulated as described below mainly by the heat treatment conditions (heating temperature and heating time) before stretching a uniaxially-stretched film, and the stretching conditions (stretching temperature and stretching speed).

Standardized molecular orientation MORc can be converted to birefringence Δn, which equals to retardation divided by film thickness. More specifically, the retardation can be measured by RETS100, by Otsuka Electronics Co., Ltd. Further, MORc and Δn are approximately in a linearly proportional relationship, and if Δn is 0, MORc is 1

For example, if an aliphatic polyester (A) is a polylactic acid-type polymer and the birefringence Δn is measured at measurement wavelength of 550 nm, the lower limit 2.0 of a preferable range for the standardized molecular orientation MORc can be converted to the birefringence Δn of 0.005. Further, the lower limit 40 of a preferable range of the product of the standardized molecular orientation MORc multiplied by the crystallinity of a polymeric piezoelectric material can be converted to 0.1 as the product of the birefringence Δn and the crystallinity of an polymeric piezoelectric material.

<Process for Producing Polymeric Piezoelectric Material>

Source materials of a polymeric piezoelectric material in the current embodiment can be obtained by mixing the aliphatic polyester (A) such as a polylactic acid-type polymer and the stabilizing agent (B) such as a carbodiimide compound, as well as, according to need, other components to a mixture. The mixture may be melt-kneaded. Specifically, the aliphatic polyester (A) and the stabilizing agent (B) to be mixed, and other components to be used according to need are melt-kneaded using a melt-kneader (LABO PLASTOMILL, by Toyo Seiki Seisaku-Sho, Ltd.) under conditions of a blender rotating speed of from 30 rpm to 70 rpm and a temperature of from 180° C. to 250° C. for 5 min to 20 min to yield a blend of the aliphatic polyester (A) and the stabilizing agent (B), a blend of plural kinds of aliphatic polyesters, and a blend of an aliphatic polyester and another component such as an inorganic filler.

A polymeric piezoelectric material according to the present invention can be produced by a producing process including a first step for yielding a pre-crystallized sheet (also referred to as a "crystallized original sheet") by crystallizing an amorphous state sheet containing, for example, an aliphatic polyester (A) and a stabilizing agent (B), and a second step for stretching the pre-crystallized sheet mainly uniaxially.

Generally by intensifying a force applied to a film during stretching, there appears tendency that the orientation of an aliphatic polyester is promoted, the piezoelectric constant is enhanced, crystallization is progressed to increase the crystal size, and consequently the haze increases. Further, as a result of increase in internal stress, the rate of dimensional change tends to increase. If a force is applied simply to a film, not oriented crystals, such as spherocrystals, are formed. Poorly oriented crystals such as spherocrystals increase the haze but hardly contribute to increase in the piezoelectric constant. Therefore to produce a film having a high piezoelectric constant, a low haze and a low rate of dimensional change, it is necessary to form efficiently such micro-sized orientated crystals, as contribute to the piezoelectric constant but not increase the haze.

In a process for producing a polymeric piezoelectric material according to the present invention, for example, prior to stretching the inner part of a sheet is pre-crystallized to form minute crystals, and thereafter the sheet is stretched. As a result, a force applied to the film during stretching comes to act efficiently on a low-crystallinity polymer part between a crystallite and a crystallite, so that an aliphatic polyester can be orientated efficiently in the main stretching direction. Specifically, in a low-crystallinity polymer part between a crystallite and a crystallite minute orientated crystals are formed and at the same time spherocrystals formed by pre-crystallization are collapsed and lamellar crystals constituting the spherocrystals are aligned as tied in a row by tie-molecular chains in the stretching direction, so as to attain a desired MORc value. As a result, a sheet with low values for the haze and the rate of dimensional change can be obtained without compromising remarkably the piezoelectric constant.

For the control of standardized molecular orientation MORc, it is important to regulate the crystallinity of a crystallized original sheet by means of the heat treatment time, the heat treatment temperature, etc. at the first step, and to regulate the stretching speed and the stretching temperature at the second step. As described above, an aliphatic polyester is a polymer having molecular optical activity. A sheet in an amorphous state containing an aliphatic polyester and a CARBODILITE compound may be one available from the market, or produced by a publicly known film forming means, such as extrusion molding. The sheet in an amorphous state may have a single layer or multi-layers.

[First Step (Pre-Crystallization Step)]

A pre-crystallized sheet can be yielded by heat-treating a sheet in an amorphous state containing an aliphatic polyester (A) and a stabilizing agent (B) for crystallization. Alternatively, source materials containing an aliphatic polyester (A) and a stabilizing agent (B) may be heated to a temperature higher than the glass transition temperature of the aliphatic polyester, and extruded to a sheet form by extrusion molding method, and the extruded sheet is then rapidly cooled at a caster to yield a pre-crystallized sheet having the predetermined crystallinity.

In this connection, 1) a pre-crystallized sheet crystallized in advance may be sent to a stretching step (second step) as described below, set on a stretching apparatus and stretched (off-line heat treatment); or 2) a sheet in an amorphous state not yet crystallized by a heat treatment may be set on a stretching apparatus and heated by the stretching apparatus for pre-crystallization, and sent continuously to a stretching step (second step) to be stretched (in-line heat treatment).

Although there is no particular restriction on a heating temperature T for pre-crystallizing a sheet in an amorphous state containing an aliphatic polyester, from viewpoints of enhancing the piezoelectricity, the transparency, etc. of a polymeric piezoelectric material produced by the production process, the temperature should be preferably set to satisfy the following relational expression with respect to the glass transition temperature Tg of the aliphatic polyester, and to make the crystallinity from 3% to 70%.

$$Tg-40°C. \leq T \leq Tg+40°C.$$

(Tg stands for the glass transition temperature of the aliphatic polyester.)

The heating time for pre-crystallization or the heating time for crystallization on the occasion of extrusion to a sheet form may be so adjusted that the desired crystallinity is attained and the product of the standardized molecular orientation MORc of a polymeric piezoelectric material after stretching (second step) and the crystallinity of the polymeric piezoelectric material after stretching preferably falls within from 40 to 700, more preferably within from 125 to 650, and further preferably within from 250 to 350. If the heating time is prolonged, the crystallinity after stretching becomes also higher and the standardized molecular orientation MORc after stretching becomes also higher. If the heating time is made shorter, the crystallinity after stretching becomes lower and the standardized molecular orientation MORc after stretching also tends to become lower.

If the crystallinity of a pre-crystallized sheet before stretching becomes high, the sheet becomes stiff and a larger stretching stress is exerted on the sheet, and therefore such parts of the sheet, where the crystallinity is relatively low, are also orientated highly to enhance also the standardized molecular orientation MORc after stretching. Reversely, conceivably, if the crystallinity of a pre-crystallized sheet before stretching becomes low, the sheet becomes soft and a stretching stress is exerted to a lesser extent on the sheet, and therefore such parts of the sheet, where the crystallinity is relatively low, are also orientated weakly to lower also the standardized molecular orientation MORc after stretching.

The heating time varies depending on heating temperature, sheet thickness, the molecular weight of a resin constituting a sheet, and the kind and quantity of an additive. While, if a sheet in an amorphous state is preheated at a temperature allowing the sheet to crystallize on the occasion of preheating which may be carried out before a stretching step (second step) described below, the actual heating time for crystallizing the sheet corresponds to the sum of the above preheating time and the heating time at the pre-crystallization step before the preheating.

The heating time for a sheet in an amorphous state or the heating time for crystallization in extruding to a sheet form is usually from 5 sec to 60 min, and from a viewpoint of stabilization of production conditions it may be from 1 min to 30 min. If, for example, a sheet in an amorphous state containing a polylactic acid-type polymer as an aliphatic polyester is pre-crystallized, heating at from 20° C. to 170° C. for from 5 sec to 60 min is preferable, and from 1 min to 30 min is also acceptable.

For imparting efficiently piezoelectricity, transparency, and high dimensional stability to a sheet after stretching, it is important to adjust the crystallinity of a pre-crystallized sheet before stretching. Since the reason behind the improvement of the piezoelectricity or the dimensional stability by stretching is believed to be that a stress by stretching is concentrated on parts of a pre-crystallized sheet where the crystallinity, presumably in a state of spherocrystal, is relatively high, so that spherocrystal are destroyed and aligned to enhance the piezoelectricity $d_{14}$, and at the same time the stretching stress is exerted through the spherocrystals on parts where the crystallinity is relatively low, promoting orientation to enhance the piezoelectricity $d_{14}$.

The crystallinity of a sheet after stretching, or, if an annealing treatment described below is conducted, the crystallinity after the annealing treatment is set to aim at from 20% to 80%, preferably at from 40% to 70%. Consequently, the crystallinity of a pre-crystallized sheet just before stretching is set at from 3% to 70%, preferably at from 10% to 60%, and more preferably at from 15% to 50%.

The crystallinity of a pre-crystallized sheet may be carried out similarly as the measurement of the crystallinity of a polymeric piezoelectric material according to the present invention after stretching.

The thickness of a pre-crystallized sheet is selected mainly according to an intended thickness of a polymeric piezoelectric material by means of stretching at the second process and the stretching ratio, and is preferably from 50 μm to 1000 μm, and more preferably about from 200 μm to 800 μm.

[Second Step (Stretching Step)]

There is no particular restriction on a stretching process for the stretching step as the second step, and various stretching processes, such as a uniaxial stretching process, a biaxial stretching process, and a solid state stretching process described below, can be used. By stretching a polymeric piezoelectric material, a polymeric piezoelectric material having a large area principal plane can be obtained.

In this regard, a "principal plane" means among surfaces of a polymeric piezoelectric material a plane with the largest area. A polymeric piezoelectric material according to the present invention may have 2 or more principal planes. For example, if a polymeric piezoelectric material is a platy body having 2 planes each of rectangular planes A of 10 mm×0.3 mm, rectangular planes B of 3 mm×0.3 mm, and rectangular planes C of 10 mm×3 mm, the principal plane of the polymeric piezoelectric material is planes C, and there are 2 principal planes.

A large area principal plane means according to the present invention the principal plane area of a polymeric piezoelectric material is 5 mm² or more. The principal plane area is preferably 10 mm² or more.

"Solid state stretching" means "stretching at a temperature higher than the glass transition temperature Tg of a polymeric piezoelectric material and lower than the melting point Tm of a polymeric piezoelectric material, and under a compression stress of from 5 MPa to 10,000 MPa", and improves further the piezoelectricity of a polymeric piezoelectric material, and can improve the transparency and the resilience.

It is presumed that molecular chains of a polylactic acid-type polymer contained in a polymeric piezoelectric material can be orientated uniaxially and aligned densely to attain higher piezoelectricity, if a polymeric piezoelectric material is stretched by solid state stretching, or stretched mainly uniaxially.

The glass transition temperature Tg [° C.] of a polymeric piezoelectric material and the melting point Tm [° C.] of a polymeric piezoelectric material are respectively a glass transition temperature (Tg) obtained as a inflection point of a curve and a temperature (Tm) recognized as a peak value of an endothermic reaction, from a melting endothermic curve obtained for a polymeric piezoelectric material using a differential scanning calorimeter (DSC) by raising the temperature under a condition of the temperature increase rate of 10° C./min.

If a polymeric piezoelectric material is stretched solely by a tensile force as in the cases of a uniaxial stretching process or a biaxial stretching process, the stretching temperature of a polymeric piezoelectric material is preferably in a range of from 10° C. to 20° C. higher than the glass transition temperature of a polymeric piezoelectric material.

In the case of a solid state stretching process, the compression stress is preferably from 50 MPa to 5,000 MPa, and more preferably from 100 MPa to 3,000 MPa.

The stretching ratio in a stretching treatment is preferably from 3-fold to 30-fold, and stretching in a range of from 4-fold to 15-fold is more preferable.

Solid state stretching of a pre-crystallized sheet is conducted under application of pressure on a polymeric piezoelectric material nipped by rolls or burettes.

When a pre-crystallized sheet is stretched, the sheet may be preheated immediately before stretching so that the sheet can be easily stretched. Since the preheating is performed generally for the purpose of softening the sheet before stretching in order to facilitate the stretching, the same is normally performed avoiding conditions that promote crystallization of a sheet before stretching and make the sheet stiff. Meanwhile, as described above, in some cases according to the current embodiment pre-crystallization is performed before stretching, and the preheating may be performed combined with the pre-crystallization. Specifically, by conducting the preheating at a higher temperature than a temperature normally used or for longer time conforming to the heating temperature or the heat treatment time at the aforementioned pre-crystallization step, preheating and pre-crystallization can be combined.

[Annealing Treatment Step]

From a viewpoint of improvement of the piezoelectric constant, a polymeric piezoelectric material after a stretching treatment (after the second step) should preferably be subjected to a certain heat treatment (hereinafter also referred to as a "annealing treatment"). In this connection, if crystallization is attained mainly by an annealing treatment, a pre-crystallization to be conducted at the afore-described pre-crystallization step may be sometimes omitted.

The temperature of an annealing treatment is preferably about from 80° C. to 160° C. and more preferably from 100° C. to 155° C.

There is no particular restriction on a method for applying a high temperature in an annealing treatment, examples thereof include a direct heating method using a hot air heater or an infrared heater, and a heating method, in which a polymeric piezoelectric material is dipped in a heated liquid such as silicone oil.

In this case, if a polymeric piezoelectric material is deformed by linear expansion, it becomes practically difficult to obtain a flat film, and therefore high temperature is applied preferably under application of a certain tensile stress (e.g. from 0.01 MPa to 100 MPa) on a polymeric piezoelectric material to prevent the polymeric piezoelectric material from sagging.

The high temperature application time at an annealing treatment is preferably from 1 sec to 60 min, more preferably from 1 sec to 300 sec, and further preferable is heating for from 1 sec to 60 sec. If annealing continues beyond 60 min, the degree of orientation may sometimes decrease due to growth of spherocrystals from molecular chains in an amorphous part at a temperature above the glass transition temperature of a polymeric piezoelectric material, and as a result the piezoelectricity or the transparency may sometimes decrease.

A polymeric piezoelectric material treated for annealing as described above is preferably rapidly cooled after the annealing treatment. In connection with an annealing treatment, "rapid cool" means that a polymeric piezoelectric material treated for annealing is dipped, for example, in ice water immediately after the annealing treatment and chilled at least to the glass transition point Tg or lower, and between the annealing treatment and the dipping in ice water, etc. there is no other treatment.

Examples of a rapidly cooling method include a dipping method, by which a polymeric piezoelectric material treated for annealing is dipped in a cooling medium, such as water, ice water, ethanol, ethanol or methanol containing dry ice, and liquid nitrogen; a cooling method, by which a liquid with the low vapor pressure is sprayed for chilling by latent heat of evaporation thereof. For chilling continuously a polymeric piezoelectric material, rapidly cooling by contacting a polymeric piezoelectric material with a metal roll regulated at a temperature below the glass transition temperature Tg of the polymeric piezoelectric material is possible. The number of cooling may be once or 2 times or more; or annealing and rapidly cooling can be repeated alternately.

A process for producing a polymeric piezoelectric material according to the present invention may include in the following order a step for stretching mainly uniaxially a sheet including the aliphatic polyester (A) and the stabilizing agent (B); and a step for conducting an annealing treatment. The step for stretching and the step for conducting an annealing treatment may be similar to the steps described above. Further, in the process for producing, the aforementioned pre-crystallization step may not be conducted.

<Physical Properties of Polymeric Piezoelectric Material>

A polymeric piezoelectric material related to the current embodiment has a high piezoelectric constant and is superior in moist heat stability.

[Piezoelectric Constant (Displacement Method)]

The piezoelectric constant (displacement method) of a polymeric piezoelectric material in the current embodiment is a value measured by a displacement method, for example, as follows.

A polymeric piezoelectric material is cut into a size of 40 mm in the stretching direction (MD direction) and 40 mm in the direction perpendicular to the stretching direction (TD direction) respectively to prepare a rectangular specimen.

The prepared specimen is set on a stage of a sputtering thin-film formation apparatus JSP-8000 by Ulvac Inc., and the inside of a coater chamber is evacuated to a vacuum state by a rotary pump (for example, $10^{-3}$ Pa or less). Then a sputtering treatment is conducted for 500 sec on a plane of the specimen under the conditions of an Ag (silver) target at an applied voltage of 280 V and a sputtering current of 0.4 A. Then an sputtering treatment is carried out on the other plane under the same conditions for 500 sec, thereby forming Ag coats on both the planes of the specimen and completing Ag conductive layers.

A specimen of 40 mm×40 mm with the Ag conductive layers on both planes thus formed is cut to a length of 32 mm in the direction of 45° with respect to the stretching direction (MD direction) of a polymeric piezoelectric material, and to 5 mm in the direction perpendicular to the above 45° direction, to cut out a piece of rectangular film in a size of 32 mm×5 mm. This was used as a sample for measuring the piezoelectric constant.

A sine-wave alternating voltage of 10 Hz and 300 Vpp was applied to the prepared sample, and a difference distance between the maximum value and the minimum value of the displacement of the film was measured by a laser spectral-interference displacement meter SI-1000 (by Keyence Corporation). A value obtained by dividing the measured displacement (mp-p) by the reference length of the film, which was 30 mm, was defined as strain, and a value obtained by dividing the strain by an electric field intensity applied to the film ((applied voltage (V))/(film thickness)) and multiplying by 2, was defined as piezoelectric constant $d_{14}$.

A higher piezoelectric constant results in the larger displacement of a polymeric piezoelectric material responding to a voltage applied to the material, and reversely the higher voltage generated responding to a force applied to a polymeric piezoelectric material, and therefore is advantageous as a polymeric piezoelectric material. Specifically, the piezoelectric constant $d_{14}$ measured by a displacement method at 25° C. is preferably 1 pm/V or higher, more preferably 4 pm/V or higher, further preferably 6 pm/V or higher, yet further preferably 8 pm/V or higher. Although there is no particular upper limit of the piezoelectric constant, it is preferably 50 pm/V or less, and sometimes more preferably 30 pm/V or less, for a piezoelectric material using an aliphatic polyester from a viewpoint of the balance with transparency, etc. as described below. Similarly, from a viewpoint of the balance with transparency, the piezoelectric constant $d_{14}$ measured by a resonance method described below is sometimes preferably 15 pC/N or less, and sometimes more preferably less than 10 pC/N.

[Piezoelectric Constant (Resonance Method)]

The piezoelectric constant (resonance method) of a polymeric piezoelectric material in the current embodiment is a value measured by a resonance method, for example, as follows.

A polymeric piezoelectric material is cut to a length of 32 mm in the stretching direction (MD direction) and to 30 mm in the direction perpendicular to the stretching direction (TD direction) to prepare a rectangular specimen.

The prepared specimen is set on a stage of QUICK COATER SC-701 (by Sanyu Electron Co., Ltd.) and the inside of a coater chamber is evacuated to a vacuum state (for example, $10^{-3}$ Pa or less) by a rotary pump. Then a sputtering treatment is conducted for 3 min on a plane of the specimen under the conditions of an Au (gold) target and a sputtering current of 4 mA. Then an sputtering treatment is carried out on the other plane under the same conditions for 3 min, thereby forming Au coats on both the planes of the specimen and completing Au conductive layers.

A specimen of 32 mm×30 mm with the Au conductive layers on both planes thus formed is cut to a length of 10 mm in the stretching direction (MD direction) of a polymeric piezoelectric material, and to 9 mm in the direction perpendicular to the stretching direction (TD direction), to cut out a piece of rectangular film. This is used as a sample for measurement by a resonance-antiresonance method.

A resonance curve of impedance that appears in a band of from 50 kHz to 100 kHz is measured with an impedance analyzer HP4194A (by Yokogawa-Hewlett-Packard) for the prepared sample for measurement by a resonance-antiresonance method. From the obtained resonance curve of impedance and a relative dielectric constant $\in_r$, a piezoelectric constant $d_{14}$ is calculated according to a method described in Jpn. J. Appl. Phys. Vol. 37 (1998) pp. 3374-3376, part 1, No. 6A, June 1998.

The obtained piezoelectric constant is defined as the piezoelectric constant of a polymeric piezoelectric material.

The relative dielectric constant $\in_r$ is calculated by the following expression (A) using a capacitance C [F] measured with LCR METER HP4284A (by Hewlett Packard) for the sample for measurement by a resonance-antiresonance method.

[Expression 1]

$$\varepsilon_r = \frac{C \times d}{\varepsilon_0 \times S} \quad \text{Expression (A)}$$

In the Expression (A), $\in_0$, C, d, $\in_r$, and S are as follows:
$\in_r$: relative dielectric constant of sample for measurement by a resonance-antiresonance method;
C: capacitance [F] of sample for measurement by a resonance-antiresonance method;
d: thickness [m] of sample for measurement by a resonance-antiresonance method;
$\in_0$: dielectric constant of vacuum; and
S: area [m$^2$] of sample for measurement by a resonance-antiresonance method

[Crystallinity]

The crystallinity of a polymeric piezoelectric material is determined by a DSC method, and the crystallinity of a polymeric piezoelectric material of the current embodiment is from 20% to 80%, preferably 25% to 70%, and more preferably 30% to 50%. If the crystallinity is within the range, the balance between the piezoelectricity and the transparency of a polymeric piezoelectric material may be favorable, and whitening or breakage is less likely to occur in stretching the polymeric piezoelectric material, and therefore production is easy.

[Transparency (Internal Haze)]

The transparency of a polymeric piezoelectric material can be evaluated, for example, by visual observation or haze measurement. The haze of a polymeric piezoelectric material in terms of internal haze with respect to visible light is preferably 50% or less, more preferably 20% or less, and further preferably 15% or less.

In this regard, the internal haze is a value measured for a polymeric piezoelectric material with the thickness of 0.05 mm using a haze meter (TC-HIII DPK, by Tokyo Denshoku Co., Ltd.) at 25° C. according to JIS-K7105, and details of the measuring method are described in Examples below. The lower the haze, the better a polymeric piezoelectric material is. However from a viewpoint of the balance with the piezoelectric constant, etc. the haze is preferably from 0.01% to 13%, and more preferably from 0.1% to 5%. Incidentally, "haze" or "internal haze" means herein the internal haze of a polymeric piezoelectric material according to the present invention. The internal haze is a haze from which a haze caused by the shape of an external surface of the polymeric piezoelectric material is excluded, as described in an Example below.

[Standardized Molecular Orientation MORc]

The standardized molecular orientation MORc of a polymeric piezoelectric material of the current embodiment is preferably from 2.0 to 15.0, preferably from 3.0 to 10.0 and more preferably from 4.0 to 8.0. If the standardized molecular orientation MORc is within the range of from 2.0 to 15.0, a large number of polylactic acid molecular chains are aligned in the stretching direction, and as a result a higher rate of generation of oriented crystals can be attained to exhibit high piezoelectricity.

[Product of Standardized Molecular Orientation MORc and Crystallinity]

The product of the crystallinity and the standardized molecular orientation MORc of a polymeric piezoelectric material is preferably from 40 to 700, further preferably from 75 to 680, further preferably from 90 to 660, further preferably from 125 to 650, and further preferably from 180 to 350. If the product of the crystallinity and the standardized molecular orientation MORc of a polymeric piezoelectric material is in the range of from 40 to 700, the polymeric piezoelectric material has good balance between the piezoelectricity and the transparency, has also high dimensional stability, and can be used favorably as a piezoelectric element described below.

Since the polymeric piezoelectric material according to the present invention is a piezoelectric material having a high piezoelectric constant $d_{14}$ and superior transparency and dimensional stability, as described above, the same can be used in various fields including a loudspeaker, a headphone, a touch panel, a remote controller, a microphone, a hydrophone, an ultrasonic transducer, an ultrasonic applied measurement instrument, a piezoelectric vibrator, a mechanical filter, a piezoelectric transformer, a delay unit, a sensor, an acceleration sensor, an impact sensor, a vibration sensor, a pressure-sensitive sensor, a tactile sensor, an electric field sensor, a sound pressure sensor, a display, a fan, a pump, a variable-focus mirror, a sound insulation material, a soundproof material, a keyboard, acoustic equipment, information processing equipment, measurement equipment, and a medical appliance In this case, a polymeric piezoelectric material according to the present invention is preferably used as a piezoelectric element having at least two planes provided with electrodes. It is enough if the electrodes are provided on at least 2 planes of the polymeric piezoelectric material. There is no particular restriction on the electrode, and examples thereof to be used include ITO, ZnO, IZO (registered trade marks), and an electroconductive polymer.

Further, a polymeric piezoelectric material according to the present invention and an electrode may be piled up one another and used as a laminated piezoelectric element. For example, units of an electrode and a polymeric piezoelectric material are piled up recurrently and finally a principal plane of a polymeric piezoelectric material not covered by an electrode is covered by an electrode. Specifically, that with 2 recurrent units is a laminated piezoelectric element having an electrode, a polymeric piezoelectric material, an electrode, a polymeric piezoelectric material, and an electrode in the mentioned order. With respect to a polymeric piezoelectric material to be used for a laminated piezoelectric element, at least one layer of polymeric piezoelectric material is required to be made of a polymeric piezoelectric material according to the present invention, and other layers may not be made of a polymeric piezoelectric material according to the present invention.

In the case that plural polymeric piezoelectric materials according to the present invention are included in a laminated piezoelectric element, if an aliphatic polyester (A) contained in a polymeric piezoelectric material according to the present invention in a layer has L-form optical activity, an aliphatic polyester (A) contained in a polymeric piezoelectric material in another layer may be either of L-form and D-form. The location of polymeric piezoelectric materials may be adjusted appropriately according to an end use of a piezoelectric element.

For example, if the first layer of a polymeric piezoelectric material containing as a main component an L-form aliphatic polyester (A) is laminated intercalating an electrode with the second polymeric piezoelectric material containing as a main component an L-form aliphatic polyester (A), the uniaxial stretching direction (main stretching direction) of the first polymeric piezoelectric material should preferably cross, especially orthogonally cross, the uniaxial stretching direction (main stretching direction) of the second polymeric piezoelectric material so that the displacement directions of the first polymeric piezoelectric material and the second polymeric piezoelectric material can be aligned, and that the piezoelectricity of a laminated piezoelectric element as a whole can be favorably enhanced.

On the other hand, if the first layer of a polymeric piezoelectric material containing as a main component an L-form aliphatic polyester (A) is laminated intercalating an electrode with the second polymeric piezoelectric material containing as a main component an D-form aliphatic polyester (A), the uniaxial stretching direction (main stretching direction) of the first polymeric piezoelectric material should preferably be arranged nearly parallel to the uniaxial stretching direction (main stretching direction) of the second polymeric piezoelectric material so that the displacement directions of the first polymeric piezoelectric material and the second polymeric piezoelectric material can be aligned, and that the piezoelectricity of a laminated piezoelectric element as a whole can be favorably enhanced.

Especially, if a principal plane of a polymeric piezoelectric material is provided with an electrode, it is preferable to provide a transparent electrode. In this regard, a transparent electrode means specifically that its internal haze is 20% or less (total luminous transmittance is 80% or more).

The piezoelectric element using a polymeric piezoelectric material according to the present invention may be applied to the aforementioned various piezoelectric devices including a loudspeaker and a touch panel. A piezoelectric element provided with a transparent electrode is favorable for applications, such as a loudspeaker, a touch panel, and an actuator.

EXAMPLES

The embodiment of the present invention will be described below in more details by way of Examples, provided that the current embodiment is not limited to the following Examples to the extent not to depart from the spirit of the embodiment.

Example 1

To 100 parts by mass of a polylactic acid-type resin (LACEA, H-400 (registered trade mark); weight-average molecular weight Mw: 200,000; by Mitsui Chemicals, Inc.) 0.1 part by mass of CARBODILITE (LA-1; by Nisshinbo Chemical Inc.) was added as a stabilizing agent (B) [a carbodiimide compound] and dry blended to prepare a source material. The prepared source material was charged into an extruder hopper, heated to 220° C. to 230° C., extruded through a T-die, and contacted with a cast roll at 55° C. for 0.5 min to form a 150 μm-thick pre-crystallized sheet (pre-crystallization step). The crystallinity of the pre-crystallized sheet was measured to be 5.63%.

Stretching of the produced pre-crystallized sheet was started at a stretching speed of 1,650 mm/min by roll-to-roll with heating at 70° C. and continued up to 3.3-fold uniaxially in the MD direction (stretching step). The thickness of the obtained film was 53 μm.

Thereafter, the uniaxially stretched film was by roll-to-roll contacted with a roll heated to 130° C. for 60 sec for an annealing treatment to produce a polymeric piezoelectric material (annealing treatment step).

Example 2 to Example 5

And Comparative Example 1

Polymeric piezoelectric materials of Example 2 to Example 5, and Comparative Example 1 were produced identically, except that the added amount of CARBODILITE LA-1, the pre-crystallization conditions, and the stretching conditions in the production of a polymeric piezoelectric material in Example 1 were changed to those described in Table 1.

Measurement of Amounts of L-Form and D-Form of Resin (Optically Active Polymer)

Into a 50 mL Erlenmeyer flask 1.0 g of a weighed-out sample (polymeric piezoelectric material) was charged, to which 2.5 mL of IPA (isopropyl alcohol) and 5 mL of a 5.0 mol/L sodium hydroxide solution were added. The Erlenmeyer flask containing the sample solution was then placed in a water bath at the temperature of 40° C., and stirred until polylactic acid was completely hydrolyzed for about 5 hours.

After the sample solution was cooled down to room temperature, 20 mL of a 1.0 mol/L hydrochloric acid solution was added for neutralization, and the Erlenmeyer flask was stoppered tightly and stirred well. The sample solution (1.0 mL) was dispensed into a 25 mL measuring flask and diluted to 25 mL with a mobile phase to prepare a HPLC sample solution 1. Into an HPLC apparatus 5 μL of the HPLC sample solution 1 was injected, and D/L-form peak areas of polylactic acid were determined under the following HPLC conditions. The amounts of L-form and D-form were calculated therefrom.

HPLC Measurement Conditions:
Column: Optical resolution column, SUMICHIRAL OA5000 (by Sumika Chemical Analysis Service, Ltd.)
Measuring apparatus: Liquid chromatography (by Jasco Corporation)
Column temperature: 25° C.
Mobile phase: 1.0 mM-copper (II) sulfate buffer solution/IPA=98/2 (V/V) Copper (II) sulfate/IPA/water=156.4 mg/20 mL/980 mL
Mobile phase flow rate: 1.0 mL/min
Detector: Ultraviolet detector (UV 254 nm)

TABLE 1

| | Physical properties | | | | | Additive | | Pre-crystallization conditions | | Pre-crystallized sheet |
| | | | | | Optical | | | | Heating | |
| | Resin | Chirality | Mw | Mw/Mn | purity (ee %) | Type | Part by mass | Heating time (min) | temperature (° C.) | Crystallinity (%) |
|---|---|---|---|---|---|---|---|---|---|---|
| Example 1 | LA | L | 200000 | 2.87 | 98.5 | CARBODILITE LA-1 | 0.1 | 0.5 min | 55° C. | 5.63 |
| Example 2 | LA | L | 200000 | 2.87 | 98.5 | CARBODILITE LA-1 | 0.3 | 0.5 min | 55° C. | 8.299 |
| Example 3 | LA | L | 200000 | 2.87 | 98.5 | CARBODILITE LA-1 | 0.5 | 0.5 min | 55° C. | 5.035 |
| Example 4 | LA | L | 200000 | 2.87 | 98.5 | CARBODILITE LA-1 | 1.0 | 0.5 min | 55° C. | 5.568 |
| Example 5 | LA | L | 200000 | 2.87 | 98.5 | CARBODILITE LA-1 | 3.0 | 0.5 min | 55° C. | 8.299 |
| Comparative Example 1 | LA | L | 200000 | 2.87 | 98.5 | None | 0.0 | 0.5 min | 55° C. | 4.53 |

| | Stretching conditions | | | | | Annealing conditions | | |
| | | | Stretching | | | | | |
| | Process | Ratio | speed (mm/min) | Temperature (° C.) | Area (mm²) | Temperature (° C.) | Time (sec) | Cooling conditions |
|---|---|---|---|---|---|---|---|---|
| Example 1 | Uniaxial stretching | 3.3 | 1650 | 70 | Width 200 mm | 130 | 60 | Rapid cooling |
| Example 2 | Uniaxial stretching | 3.3 | 1650 | 70 | Width 200 mm | 130 | 60 | Rapid cooling |
| Example 3 | Uniaxial stretching | 3.3 | 1650 | 70 | Width 200 mm | 130 | 60 | Rapid cooling |
| Example 4 | Uniaxial stretching | 3.3 | 1650 | 70 | Width 200 mm | 130 | 60 | Rapid cooling |
| Example 5 | Uniaxial stretching | 3.3 | 1650 | 70 | Width 200 mm | 130 | 60 | Rapid cooling |
| Comparative Example 1 | Uniaxial stretching | 3.3 | 1650 | 70 | Width 200 mm | 130 | 60 | Rapid cooling |

<Molecular Weight Distribution>

The molecular weight distribution (Mw/Mn) of a resin (optically active polymer) contained in each polymeric piezoelectric material of Examples and Comparative Examples was measured using a gel permeation chromatograph (GPC) by the following GPC measuring method.

GPC Measuring Method:

Measuring apparatus: GPC-100 (by Waters)

Column: SHODEX LF-804 (by Showa Denko K.K.)

Preparation of sample: Each polymeric piezoelectric material of Examples and Comparative Examples was dissolved in a solvent (chloroform) at 40° C. to prepare a sample solution with the concentration of 1 mg/mL.

Measuring conditions: 0.1 mL of a sample solution was introduced into the column at a temperature of 40° C. and a flow rate of 1 mL/min by using chloroform as a solvent, and the concentration of the sample that was contained in the sample solution and separated by the column was measured by a differential refractometer. With respect to the molecular weight of a resin, a universal calibration curve was prepared using polystyrene standard samples, and the weight-average molecular weight (Mw) for each resin was calculated therefrom. The measurement results for resins used in Examples and Comparative Example are shown in Table 1. In Table 1 "LA stands for LACEA H-400. Further, the added amount of CARBODILITE LA1 is expressed in part by mass with respect to 100 parts by mass of LACEA H-400.

<Measurement of Physical Properties and Evaluation>

With respect to polymeric piezoelectric materials of Example 1 to Example 5, and Comparative Example 1 obtained as above, the glass transition temperature Tg, melting point Tm, crystallinity, specific heat capacity Cp, thickness, internal haze, piezoelectric constant, standardized molecular orientation MORc, dimensional stability, and reliability concerning moist heat resistance for each polymeric piezoelectric material were measured. The results are shown in Table 2. The measurements were carried out specifically as follows.

[Glass Transition Temperature Tg, Melting Point Tm, and Crystallinity]

Each 10 mg of respective polymeric piezoelectric materials of Examples and Comparative Examples was weighed accurately and measured by a differential scanning calorimeter (DSC-1, by Perkin Elmer Inc.) at a temperature increase rate of 10° C./min to obtain a melting endothermic curve. From the obtained melting endothermic curve the melting point Tm, glass transition temperature Tg, specific heat capacity Cp and crystallinity were obtained.

[Specific Heat Capacity Cp]

The amount of heat required to elevate the temperature by 1° C. per 1 g was measured when the respective polymeric piezoelectric materials of Examples and Comparative Examples were measured by the differential scanning calorimeter. The measurement conditions were similar to the conditions for Tg and Tm.

[Dimensional Stability]

A stretched film was cut to a length of 50 mm in the stretching direction (MD direction) and to 50 mm in the direction perpendicular to the stretching direction (TD direction) to cut out a piece of 50 mm×50 mm rectangular film. The film was hanged in an oven set at 85° C. and subjected to an annealing treatment for 30 min. The length of the side of the rectangular film in the MD direction before and after the annealing was measured by calipers, and the rate of dimensional change (%) was calculated according to the following expression. Form the absolute value of the rate of dimensional change the dimensional stability was evaluated. If the rate of dimensional change is lower, it means the dimensional stability is the higher.

Rate of dimensional change(%)=100×[(side length in the MD direction before annealing)−(side length in the MD direction after annealing)]/(side length in the MD direction before annealing)

[Internal Haze]

"Haze" or "internal haze" means herein the internal haze of a polymeric piezoelectric material according to the present invention, and measured by a common measuring method. Specifically, the internal haze values of respective polymeric piezoelectric materials of Examples and Comparative Examples were measured by measuring the light transmittance in the thickness direction using the following apparatus under the following conditions. The internal haze of a polymeric piezoelectric material according to the present invention (hereinafter also referred to as "internal haze (H1)") was measured as follows: The haze (H2) was measured by placing in advance only a silicone oil (Shin-Etsu Silicone (trade mark), grade: KF96-100CS; by Shin-Etsu Chemical Co., Ltd.) between 2 glass plates, and then the haze (H3) was measured by placing a film, whose surfaces were wetted uniformly with the silicone oil, between 2 glass plates. The internal haze (H1) of a polymeric piezoelectric material according to the present invention was obtained by calculating the difference between the two according to the following expression:

Internal haze($H1$)=haze($H3$)−haze($H2$)

For measurement of a haze value of respective polymeric piezoelectric materials of Examples and Comparative Examples, the haze (H2) and haze (H3) were determined by measuring the light transmittance in the thickness direction using the following apparatus under the following measuring conditions, and the internal haze (H1) of a polymeric piezoelectric material was calculated.

Measuring apparatus: HAZE METER TC-HIIIDPK (by Tokyo Denshoku Co., LTD.)

Sample size: Width 30 mm×length 30 mm, thickness 0.05 mm

Measuring conditions: According to JIS-K7105

Measuring temperature: Room temperature (25° C.)

[Piezoelectric Constant $d_{14}$ (by Displacement Method)]

A specimen of 40 mm×40 mm with the Ag conductive layers on both planes formed was cut to a length of 32 mm in the direction of 45° with respect to the stretching direction (MD direction) of a polymeric piezoelectric material, and to 5 mm in the direction perpendicular to the above 45° direction, to cut out a piece of rectangular film in a size of 32 mm×5 mm. This was used as a sample for measuring the piezoelectric constant. A sine-wave alternating voltage of 10 Hz and 300 Vpp was applied to the prepared sample, and a difference distance between the maximum value and the minimum value of the displacement of the film was measured by a laser spectral-interference displacement meter SI-1000 (by Keyence Corporation).

A value obtained by dividing the measured displacement (mp-p) by the reference length of the film, which was 30 mm, was defined as strain, and a value obtained by dividing the strain by an electric field intensity applied to the film ((applied voltage (V))/(film thickness)) and multiplying by 2, was defined as piezoelectric constant $d_{14}$ (pm/V).

[Standardized Molecular Orientation MORc]

Standardized molecular orientation MORc was measured by a microwave molecular orientation meter MOA-6000 by Oji Scientific Instruments Co., Ltd. The reference thickness tc was set at 50 μm.

[Reliability (Moist Heat Resistance) Test I]

A polymeric piezoelectric material immediately after production was cut to a rectangular specimen with the size of 50 mm in the longitudinal direction and 50 mm in the width direction. The specimen was hanged in a thermo-hygrostat keeping 60° C. and RH 90%. After the storage in the thermo-hygrostat for a predetermined time period, the specimen was taken out and the molecular weight Mw was measured similarly as by the "GPC measuring method". In Table 2 a standardized value, which is obtained by dividing the molecular weight Mw of a specimen after the storage in the thermo-hygrostat for 96 hours, 192 hours, or 500 hours by the molecular weight Mw of the specimen immediately after production. A larger standardized value above 1 means that hydrolysis is better inhibited and the reliability is that much enhanced.

The mixture solid was heat-pressed at 205° C. for 1 min, and then pressed by a press set at 20° C. to yield a rapidly cooled film. A pair of opposed sides of the rapidly cooled film were fixed by clips and the film was stretched in the direction orthogonal to the fixed sides with heating at 70° C. until 3.3-fold to obtain a stretched film. The obtained film was annealed at 130° C. for 600 sec, and then rapidly cooled to obtain the polymeric piezoelectric material of Example 6.

Example 7 to Example 24

And Comparative Example 2 to Comparative Example 6

A polymeric piezoelectric material was obtained identically with Example 6, except that the kind of a polylactic acid

TABLE 2

| | Tg (° C.) | Cp (J/g° C.) | Tm (° C.) | Crystallinity (%) | Thickness (μm) | MORc @50 μm | Internal haze (%) | Piezoelectric constant (pm/V) | MORc × Crystallinity | Rate of dimensional change (%) | Reliability test results 96 hours | 192 hours | 500 hours |
|---|---|---|---|---|---|---|---|---|---|---|---|---|---|
| Example 1 | 67.0 | 0.030 | 171.4 | 47.0 | 53.0 | 5.17 | 0.3 | 6.16 | 243 | 1.41 | 0.94 | 0.91 | 0.40 |
| Example 2 | 68.6 | 0.046 | 171.1 | 43.1 | 48.3 | 4.89 | 0.2 | 6.28 | 211 | 1.69 | 1.02 | 1.02 | 0.48 |
| Example 3 | 63.8 | 0.075 | 170.3 | 40.3 | 45.3 | 4.86 | 0.6 | 6.09 | 196 | 2.02 | 1.08 | 1.08 | 0.56 |
| Example 4 | 74.0 | 0.112 | 171.1 | 40.0 | 52.3 | 4.84 | 1.4 | 5.77 | 194 | 1.68 | 1.00 | 1.13 | 1.00 |
| Example 5 | 65.8 | 0.183 | 170.2 | 43.0 | 47.3 | 4.24 | 13.1 | 5.91 | 182 | 2.10 | 1.16 | 1.08 | 0.98 |
| Comparative Example 1 | 64.6 | 0.078 | 170.7 | 41.4 | 50.3 | 4.83 | 0.8 | 6.14 | 200 | 0.00 | 0.94 | 0.81 | 0.26 |

Example 6

A polylactic acid solution is prepared by dissolving 10 g of polylactic acid (H400) in 200 g of chloroform (Wako EP Grade, by Wako Pure Chemical Industries, Ltd.) at room temperature.

Next, a stabilizing agent solution is prepared by dissolving 3 parts by mass of a stabilizing agent B2-2 (a compound listed in Table 3) with respect to 100 parts by mass of the polylactic acid in 10 g of chloroform at room temperature.

The polylactic acid solution and the stabilizing agent solution thus prepared were mixed at room temperature and stirred for 30 min. The solution was left standing for drying at 50° C. under 0.2 atm for 12 hours to obtain a mixture solid.

and the kind and amount of a stabilizing agent to be used were changed to those specified in the following Table 3. In this regard, the area of the principal plane of a polymeric piezoelectric material described as Example or Comparative Example was in any case 10 mm$^2$ or larger.

The added amount of a stabilizing agent in the following Table 3 is an added amount (part by mass) with respect to 100 parts by mass of a polymer (A). Further, the molecular weight of a stabilizing agent (B1-1) is a weight-average molecular weight, and the molecular weights of stabilizing agents (B2-1 to B2-3) and comparative stabilizing agents (B1-2, B2-4) are expressed by a weight-average molecular weight.

TABLE 3

| | Polymer (A) | | | | | Stabilizing agent (B1) or comparative stabilizing agent | | | Stabilizing agent (B2) | | |
|---|---|---|---|---|---|---|---|---|---|---|---|
| | Resin | Chirality | Mw | Mw/Mn | Optical purity (% ee) | Type | Molecular weight | Added amount | Type | Molecular weight | Added amount |
| Example 6 | LA | L | 200000 | 2.87 | 98.5 | — | — | — | B2-2 | approx. 3000 | 3 |
| Example 7 | LA | L | 200000 | 2.87 | 98.5 | B1-1 | 363 | 1 | — | — | — |
| Example 8 | LA | L | 200000 | 2.87 | 98.5 | B1-1 | 363 | 2 | — | — | — |
| Example 9 | LA | L | 200000 | 2.87 | 98.5 | B1-1 | 363 | 4 | — | — | — |
| Example 10 | LA | L | 200000 | 2.87 | 98.5 | B1-1 | 363 | 0.5 | B2-1 | approx. 2000 | 0.5 |
| Example 11 | LA | L | 200000 | 2.87 | 98.5 | B1-1 | 363 | 2 | B2-1 | approx. 2000 | 0.5 |
| Example 12 | LA | L | 200000 | 2.87 | 98.5 | B1-1 | 363 | 2 | B2-1 | approx. 2000 | 3 |
| Example 13 | LA | L | 200000 | 2.87 | 98.5 | B1-1 | 363 | 2 | B2-2 | approx. 3000 | 0.5 |
| Example 14 | LA | L | 200000 | 2.87 | 98.5 | B1-1 | 363 | 2 | B2-2 | approx. 3000 | 3.15 |
| Example 15 | LA | L | 200000 | 2.87 | 98.5 | B1-1 | 363 | 2 | B2-2 | approx. 3000 | 3.15 |
| Example 16 | LA | L | 200000 | 2.87 | 98.5 | B1-1 | 363 | 4 | B2-2 | approx. 3000 | 1 |
| Example 17 | LA | L | 200000 | 2.87 | 98.5 | B1-1 | 363 | 4 | B2-2 | approx. 3000 | 1 |
| Example 18 | LA | L | 200000 | 2.87 | 98.5 | B1-1 | 363 | 2 | B2-1 | approx. 2000 | 0.3 |
| | | | | | | | | | B2-2 | approx. 3000 | 0.2 |

TABLE 3-continued

| | | | | | | | | | | | |
|---|---|---|---|---|---|---|---|---|---|---|---|
| Example 19 | LA | L | 200000 | 2.87 | 98.5 | B1-1 | 363 | 2 | B2-1 | approx. 2000 | 0.15 |
| | | | | | | | | | B2-2 | approx. 3000 | 0.1 |
| Example 20 | LA | L | 200000 | 2.87 | 98.5 | — | — | — | B2-3 | 20000 | 1 |
| Example 21 | LA | L | 200000 | 2.87 | 98.5 | — | — | — | B2-3 | 20000 | 3 |
| Example 22 | LA | L | 200000 | 2.87 | 98.5 | B1-1 | 363 | 1 | B2-3 | 20000 | 1 |
| Example 23 | LA | L | 200000 | 2.87 | 98.5 | B1-1 | 363 | 2 | B2-3 | 20000 | 1 |
| Example 24 | LA | L | 200000 | 2.87 | 98.5 | B1-1 | 363 | 2 | B2-3 | 20000 | 3 |
| Comparative Example 2 | LA | L | 200000 | 2.87 | 98.5 | — | — | — | — | — | — |
| Comparative Example 3 | LA | L | 200000 | 2.87 | 98.5 | B2-4 | 216 | 3.1 | — | — | — |
| Comparative Example 4 | LA | L | 200000 | 2.87 | 98.5 | B2-4 | 216 | 5.3 | — | — | — |
| Comparative Example 5 | LA | L | 200000 | 2.87 | 98.5 | B1-2 | 126 | 2 | — | — | — |
| Comparative Example 6 | LA | L | 200000 | 2.87 | 95.8 | B1-1 | 363 | 0.5 | B2-1 | approx. 2000 | 0.5 |

| | Pre-crystallization conditions | | Pre-crystallized sheet | Stretching conditions | | | Annealing conditions | | |
|---|---|---|---|---|---|---|---|---|---|
| | Heating time (min) | Heating temperature (° C.) | Crystallinity (%) | Process | Ratio | Temperature (° C.) | Temperature (° C.) | Time (sec) | Cooling conditions |
| Example 6 | 0 | — | 0 | Batchwise uniaxial stretching | 3.3 | 70 | 130 | 600 | Rapid cooling |
| Example 7 | 0 | — | 0 | Batchwise uniaxial stretching | 3.3 | 70 | 130 | 600 | Rapid cooling |
| Example 8 | 0 | — | 0 | Batchwise uniaxial stretching | 3.3 | 70 | 130 | 600 | Rapid cooling |
| Example 9 | 0 | — | 0 | Batchwise uniaxial stretching | 3.3 | 70 | 130 | 600 | Rapid cooling |
| Example 10 | 0 | — | 0 | Batchwise uniaxial stretching | 3.3 | 70 | 130 | 600 | Rapid cooling |
| Example 11 | 0 | — | 0 | Batchwise uniaxial stretching | 3.3 | 70 | 130 | 600 | Rapid cooling |
| Example 12 | 0 | — | 0 | Batchwise uniaxial stretching | 3.3 | 70 | 130 | 600 | Rapid cooling |
| Example 13 | 0 | — | 0 | Batchwise uniaxial stretching | 3.3 | 70 | 130 | 600 | Rapid cooling |
| Example 14 | 0 | — | 0 | Batchwise uniaxial stretching | 3.3 | 70 | 130 | 600 | Rapid cooling |
| Example 15 | 0 | — | 0 | Batchwise uniaxial stretching | 3.3 | 70 | 130 | 600 | Rapid cooling |
| Example 16 | 0 | — | 0 | Batchwise uniaxial stretching | 3.3 | 70 | 130 | 600 | Rapid cooling |
| Example 17 | 0 | — | 0 | Batchwise uniaxial stretching | 3.3 | 70 | 130 | 600 | Rapid cooling |
| Example 18 | 0 | — | 0 | Batchwise uniaxial stretching | 3.3 | 70 | 130 | 600 | Rapid cooling |
| Example 19 | 0 | — | 0 | Batchwise uniaxial stretching | 3.3 | 70 | 130 | 600 | Rapid cooling |
| Example 20 | 0 | — | 0 | Batchwise uniaxial stretching | 3.3 | 70 | 130 | 600 | Rapid cooling |
| Example 21 | 0 | — | 0 | Batchwise uniaxial stretching | 3.3 | 70 | 130 | 600 | Rapid cooling |
| Example 22 | 0 | — | 0 | Batchwise uniaxial stretching | 3.3 | 70 | 130 | 600 | Rapid cooling |
| Example 23 | 0 | — | 0 | Batchwise uniaxial stretching | 3.3 | 70 | 130 | 600 | Rapid cooling |
| Example 24 | 0 | — | 0 | Batchwise uniaxial stretching | 3.3 | 70 | 130 | 600 | Rapid cooling |
| Comparative Example 2 | 0 | — | 0 | Batchwise uniaxial stretching | 3.3 | 70 | 130 | 600 | Rapid cooling |
| Comparative Example 3 | 0.3 | 50 | — | Continuous uniaxial stretching | 3.3 | 80 | 130 | 78 | Rapid cooling |
| Comparative Example 4 | 0.3 | 50 | — | Continuous uniaxial stretching | 3.3 | 80 | 130 | 78 | Rapid cooling |
| Comparative Example 5 | 0 | — | 0 | Batchwise uniaxial stretching | 3.3 | 70 | 130 | 600 | Rapid cooling |
| Comparative Example 6 | 0 | — | 0 | Batchwise uniaxial stretching | 3.3 | 70 | 130 | 600 | Rapid cooling |

The details of stabilizing agents listed in Table 3 are as follows. The structures of the compounds are shown below.

Stabilizing agent B1-1: B2756 (trade name), by Tokyo Chemical Industry Co., Ltd.; bis-2,6-diisopropylphenylcarbodiimide;

Stabilizing agent B2-1: CARBODILITE LA-1 (trade name), by Nisshinbo Chemical Inc.; poly(4,4'-dicyclohexylmethanecarbodiimide): weight-average molecular weight: approx. 2000;

Stabilizing agent B2-2: STABAXOL P (trade name), by Rhein Chemie Rheinau GmbH; poly(1,3,5-triisopropylphenylene-2,4-carbodiimide): weight-average molecular weight: approx. 3000;

Stabilizing agent B2-3: STABAXOL P400 (trade name), by Rhein Chemie Rheinau GmbH; poly(1,3,5-triisopropylphenylene-2,4-carbodiimide): weight-average molecular weight: 20000;

Comparative stabilizing agent B2-4: MS571 (trade name), by Mikuni Pharmaceutical Industrial Co., Ltd.; 1,3-PBO, namely 2,2'-(1,3-phenylene)-bis(2-oxazoline); and Comparative stabilizing agent B1-2: diisopropylcarbodiimide: molecular weight: 126

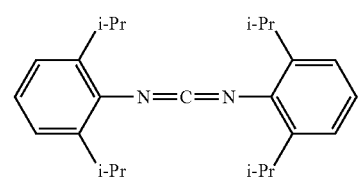

Stabilizing agent B1-1
B2756 or
Stabaxol I

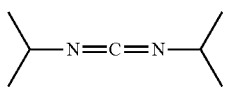

Stabilizing agent B1-2
diisopropylcarbodiimide

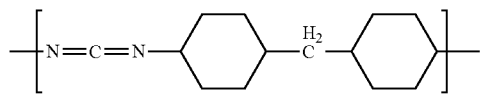

Stabilizing agent B2-1
LA-1

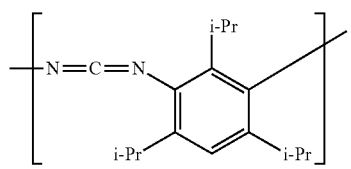

Stabilizing agent B2-2
Stabaxol P

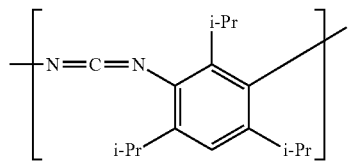

Stabilizing agent B2-3
Stabaxol P400

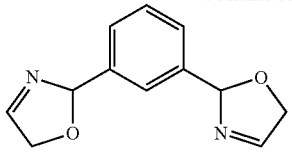

Comparative Stabilizing agent B2-4
1.3-PBO

The melting point (Tm), crystallinity, MORc and initial internal haze, piezoelectric constant (pm/V), and weight-average molecular weight of a resin were evaluated with respect to Example 6 to Example 24 and Comparative Example 2 to Comparative Example 6 identically with Example 1. The results are shown in the following Table 4.

With respect to the reliability (moist heat resistance) test, evaluation (reliability test II) was carried out identically with the reliability test I except that a specimen was stored in the atmosphere of 85° C., 85% RH. The internal haze and the weight-average molecular weight were measured after storage for 200 hours, or 500 hours similarly as at the initial stage.

In this case the molecular weight change is expressed by a standardized value obtained by dividing the molecular weight Mw of a specimen after storage in the thermo-hygrostat for 200 hours or 500 hours by the weight-average molecular weight Mw of the specimen immediately after production. If the standardized value is larger than 1; or even if it is less than 1, if the decrease rate is small, this supports that the hydrolysis tendency is suppressed and the reliability is good.

In the following Table 4 the notation of "Unable to measure" with respect to the molecular weight means that the molecular weight could not be measured, because the molecular weight was too low and the sample became liquid. In the following evaluation, if the molecular weight change after storage for 200 hours in a moist heat environment is 0.3 or less, specifically the material with the value between 0.7 and 1.3 is judged to have adequate reliability.

TABLE 4

|  | Physical properties of piezoelectric material | | | | Initial stage | |
| --- | --- | --- | --- | --- | --- | --- |
|  | Tm (° C.) | Crystallinity (%) | MORc @50 μm | MORc × Crystallinity | Internal haze (%) | Piezoelectric constant (pm/V) |
| Example 6 | 165.4 | 36.9 | 5.74 | 212 | 36.1 | 6.1 |
| Example 7 | 164.6 | 37.6 | 5.85 | 220 | 0.3 | 6.5 |
| Example 8 | 165.0 | 36.7 | 5.57 | 204 | 0.3 | 6.0 |
| Example 9 | 163.8 | 37.6 | 5.10 | 192 | 0.6 | 6.7 |
| Example 10 | 164.8 | 34.5 | 5.93 | 205 | 0.6 | 6.1 |
| Example 11 | 164.4 | 37.1 | 5.03 | 187 | 1 | 7.0 |
| Example 12 | 164.7 | 34.9 | 5.29 | 185 | 37.9 | 6.2 |
| Example 13 | 164.4 | 38.9 | 5.14 | 200 | 1.4 | 6.5 |
| Example 14 | 164.2 | 38.0 | 5.22 | 198 | 44.3 | 6.1 |
| Example 15 | 165.0 | 37.4 | 4.88 | 183 | 42.3 | 6.2 |
| Example 16 | 163.3 | 37.4 | 5.09 | 190 | 10.8 | 6.2 |
| Example 17 | 163.5 | 36.9 | 4.71 | 174 | 15 | 5.9 |
| Example 18 | 164.2 | 36.6 | 5.31 | 194 | 1.2 | 6.6 |
| Example 19 | 165.2 | 35.8 | 5.19 | 186 | 0.8 | 6.3 |
| Example 20 | 165.4 | 33.2 | 5.86 | 195 | 0.8 | 6.1 |
| Example 21 | 165.3 | 31.6 | 5.78 | 183 | 0.5 | 6.1 |
| Example 22 | 165.1 | 33.3 | 5.64 | 188 | 0.3 | 6.5 |
| Example 23 | 164.4 | 36.9 | 5.73 | 211 | 0.4 | 6.1 |
| Example 24 | 164.6 | 35.4 | 5.16 | 183 | 0.4 | 5.8 |
| Comparative Example 2 | 165.5 | 41.5 | 5.64 | 234 | 0.6 | 6.7 |
| Comparative Example 3 | 165.8 | 33.9 | 4.50 | 153 | 0.3 | 6.1 |
| Comparative Example 4 | 166.5 | 33.7 | 4.04 | 136 | 0 | 5.6 |

TABLE 4-continued

| | | | | | | |
|---|---|---|---|---|---|---|
| Comparative Example 5 | 166.5 | 36.8 | 5.88 | 216 | 0.7 | 6.4 |
| Comparative Example 6 | 166.5 | 17.7 | 4.02 | 71 | 0.5 | 5.4 |

| | Results of reliability test II | | | |
|---|---|---|---|---|
| | 200 hours | | 500 hours | |
| | Internal haze (%) | Molecular weight change | Internal haze (%) | Molecular weight change |
| Example 6 | 33.4 | 0.97 | Unable to measure | 0.24 |
| Example 7 | 0.5 | 0.97 | Unable to measure | Unable to measure |
| Example 8 | 0.6 | 1.03 | 0.5 | 0.66 |
| Example 9 | 0.8 | 0.97 | Unable to measure | Unable to measure |
| Example 10 | 0.8 | 0.99 | Unable to measure | Unable to measure |
| Example 11 | 0.9 | 0.96 | Unable to measure | Unable to measure |
| Example 12 | 40.5 | 1.01 | Unable to measure | Unable to measure |
| Example 13 | 1.1 | 0.98 | Unable to measure | Unable to measure |
| Example 14 | 36.2 | 0.99 | 40.9 | 0.85 |
| Example 15 | 45.1 | 0.99 | 43.4 | 0.90 |
| Example 16 | 13.1 | 0.96 | 9.8 | 0.86 |
| Example 17 | 11.1 | 0.98 | 12.5 | 0.84 |
| Example 18 | 1.4 | 0.94 | Unable to measure | Unable to measure |
| Example 19 | 0.9 | 0.94 | Unable to measure | Unable to measure |
| Example 20 | 0.4 | 0.69 | Unable to measure | Unable to measure |
| Example 21 | 1.4 | 1.06 | 2.7 | 0.45 |
| Example 22 | 0.3 | 0.98 | 2.3 | 0.54 |
| Example 23 | 0.8 | 1.03 | 0.4 | 0.94 |
| Example 24 | 1.0 | 1.01 | 2.0 | 0.93 |
| Comparative Example 2 | Unable to measure | Unable to measure | Unable to measure | Unable to measure |
| Comparative Example 3 | Unable to measure | Unable to measure | Unable to measure | Unable to measure |
| Comparative Example 4 | Unable to measure | Unable to measure | Unable to measure | Unable to measure |
| Comparative Example 5 | Unable to measure | Unable to measure | Unable to measure | Unable to measure |
| Comparative Example 6 | Unable to measure | Unable to measure | Unable to measure | Unable to measure |

As obvious from Table 4, the internal haze of the polymeric piezoelectric materials of Example 6 to Example 24 was as low as 50% or less, and the piezoelectric constant was good. Further, even after storage under high temperature high humidity for 200 hours, the change in the internal haze was minimal demonstrating good moist heat resistance. Moreover, even after storage under high temperature high humidity for 500 hours, the change in the internal haze and the molecular weight with respect to the polymeric piezoelectric materials of Example 14 to Example 17, Example 23 and Example 24 was small demonstrating good moist heat resistance even under very severe conditions.

Example 25 to Example 26

Polymeric piezoelectric materials were produced according to the conditions described in the following Table 5. The added amount of a stabilizing agent in the following Table 5 expresses an added amount (part by mass) with respect to 100 parts by mass of a polymer (A).

TABLE 5

| | Optically active polymer (A) | | | | | Stabilizing agent (B1) | | | Stabilizing agent (B2) | | |
|---|---|---|---|---|---|---|---|---|---|---|---|
| | Resin | Chirality | Mw | Mw/Mn | Optical purity (% ee) | Type | Molecular weight | Added amount | Type | Molecular weight | Added amount |
| Example 25 | LA | L | 200000 | 2.87 | 98.5 | — | — | — | B2-1 | approx. 2000 | 0.9 |
| Example 26 | LA | L | 200000 | 2.87 | 98.5 | B1-1 | 363 | 1 | — | — | — |

| | Pre-crystallization conditions | | Pre-crystallized sheet Crystallinity (%) | Stretching conditions | | Annealing conditions | | Cooling conditions |
|---|---|---|---|---|---|---|---|---|
| | Heating time (min) | Heating temperature (° C.) | | Process | Ratio | Temperature (° C.) | Temperature (° C.) | Time (sec) |
| Example 25 | 0.3 | 50 | — | Continuous uniaxial stretching | 3.3 | 80 | 130 | 78 | Rapid cooling |

TABLE 5-continued

| Example 26 | 0.3 | 50 | — | Continuous uniaxial stretching | 3.3 | 80 | 130 | 78 | Rapid cooling |

The melting point (Tm), crystallinity, MORc, internal haze, piezoelectric constant (pmN), and weight-average molecular weight of resins with respect to Example 25 to Example 26 were evaluated as in Example 1. The results are shown in the following Table 6.

The reliability (moist heat resistance) test was carried out for evaluation identically with the reliability test I except that a specimen was stored in the atmosphere of 60° C., 95% RH. After storage for 500 hours the internal haze, piezoelectric constant and weight-average molecular weight were measured same as at the initial stage. In Table 6 is shown a standardized value obtained by dividing the molecular weight Mw of a specimen after storage under the above described conditions for 500 hours by the molecular weight Mw of a specimen immediately after production. The higher the standardized value above 1 is; or even if it is less than 1, if the decrease rate is small, this means that the hydrolysis tendency is suppressed and the reliability is enhanced.

The rate of dimensional change II was evaluated identically with Example 1 except that the heat treatment is changed to 100° C. for 30 min.

TABLE 6

| | Physical properties of piezoelectric material | | | | Initial stage | | Results of reliability test (60° C.95%) 500 hours | | |
|---|---|---|---|---|---|---|---|---|---|
| | Tm (° C.) | Crystallinity (%) | MORc@50 μm | MORc × Crystallinity | Internal haze (%) | Piezoelectric constant (pm/V) | Rate of dimensional change II (%) | Internal haze (%) | Piezoelectric constant (pm/V) | Molecular weight change |
| Example 25 | 165.6 | 38.1 | 4.60 | 175 | 0.8 | 6.1 | 1.30 | 2.1 | 6.8 | 0.65 |
| Example 26 | 164.6 | 39.8 | 4.73 | 188 | 0.0 | 6.2 | 0.32 | 0.5 | 6.3 | 0.94 |

Japanese Patent Application Nos. 2012-39368 and 2011-225899 are incorporated herein by reference.

All publications, patent applications, and technical standards mentioned in this specification are herein incorporated by reference to the same extent as if each individual publication, patent application, or technical standard was specifically and individually indicated to be incorporated by reference.

The invention claimed is:

1. A polymeric piezoelectric material comprising:
an aliphatic polyester (A) with a weight-average molecular weight of from 50,000 to 1,000,000 and having optical activity; and
a stabilizing agent (B) with a weight-average molecular weight of from 300 to 900 that comprises a stabilizing agent (B3) having, in a molecule, only one functional group selected from the group consisting of a carbodiimide group, an epoxy group and an isocyanate group,
wherein the crystallinity of the material obtained by a DSC method is from 20% to 80%, and a content of the stabilizing agent (B) is from 0.01 part by mass to 10 parts by mass with respect to 100 parts by mass of the aliphatic polyester (A).

2. The polymeric piezoelectric material according to claim 1, wherein internal haze with respect to visible light is 50% or less, and a piezoelectric constant d14 measured by a displacement method at 25° C. is 1 pm/V or higher.

3. The polymeric piezoelectric material according to claim 1, wherein internal haze is 13% or less.

4. The polymeric piezoelectric material according to claim 1, wherein a content of the stabilizing agent (B) is from 0.01 to 2.8 parts by mass with respect to 100 parts by mass of the aliphatic polyester (A).

5. The polymeric piezoelectric material according to claim 1, wherein a product of a standardized molecular orientation MORc measured by a microwave transmission molecular orientation meter based on a reference thickness of 50 μm and the crystallinity is from 40 to 700.

6. The polymeric piezoelectric material according to claim 1, wherein the aliphatic polyester (A) is a polylactic acid polymer having a main chain comprising a repeating unit represented by the following formula (1):

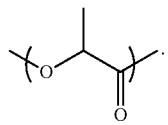

(1)

7. The polymeric piezoelectric material according to claim 1, wherein the aliphatic polyester (A) has an optical purity of 95.00% ee or higher.

8. The polymeric piezoelectric material according to claim 1, wherein a content of the aliphatic polyester (A) is 80 mass % or higher.

9. The polymeric piezoelectric material according to claim 1, wherein an area of the principal plane is 5 mm² or higher.

10. A process for producing the polymeric piezoelectric material according to claim 1 comprising:
a first step for yielding a pre-crystallized sheet comprising the aliphatic polyester (A) and the stabilizing agent (B), and
a second step for stretching the pre-crystallized sheet mainly uniaxially.

11. The process for producing the polymeric piezoelectric material according to claim 10, wherein an annealing treatment is conducted after the second step.

12. A process for producing the polymeric piezoelectric material according to claim 1 comprising, in the following order:
- a step for stretching, mainly uniaxially, a sheet comprising the aliphatic polyester (A) and the stabilizing agent (B); and
- a step for conducting an annealing treatment.

* * * * *